(12) United States Patent
Hoshi et al.

(10) Patent No.: US 7,462,873 B2
(45) Date of Patent: Dec. 9, 2008

(54) STACKED THREE DIMENSIONAL PHOTONIC CRYSTAL, LIGHT EMITTING DEVICE, AND IMAGE DISPLAY APPARATUS

(75) Inventors: Hikaru Hoshi, Tochigi-Ken (JP);
Akinari Takagi, Tochigi-Ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 671 days.

(21) Appl. No.: 11/100,588

(22) Filed: Apr. 7, 2005

(65) Prior Publication Data
US 2005/0238310 A1  Oct. 27, 2005

(30) Foreign Application Priority Data
Apr. 12, 2004 (JP) ............... 2004-116806
Mar. 31, 2005 (JP) ............... 2005-102596

(51) Int. Cl.
*H01L 33/00* (2006.01)
*H01S 3/082* (2006.01)
(52) U.S. Cl. .......................... 257/88; 372/97
(58) Field of Classification Search ............. 257/88; 372/97; 385/129
See application file for complete search history.

(56) References Cited

U.S. PATENT DOCUMENTS 5,784,400 A   7/1998   Joannopoulos et al. ........ 372/96

2003/0235229 A1   12/2003   Deng et al. .................... 372/96
2007/0031108 A1*   2/2007   Sugita et al. ................. 385/147

FOREIGN PATENT DOCUMENTS

JP   06-283812   10/1994

OTHER PUBLICATIONS

Yablonovitch, Eli, *Inhibited Spontaneous Emission in Solid-State Physics and Electronics*, The American Physical Society, Physical Review Letters, vol. 58, No. 20, pp. 2059-2062 (1987).
Okano, Makoto et al., *Analysis and Design of Single-defect Cavities in a Three-dimensional Photonic Crystal*, The American Physical Society, Physical Review Letters, vol. 66, No. 16, pp. 165211-1 to 165211-6 (2002).
Hirayama, Hideki et al., *Novel Surface Emitting Laser Diode Using Photonic Band-gap Crystal Cavity*, The American Institute of Physics, Applied Physics Letters, vol. 69, No. 6, pp. 791 to 793 (1996).

* cited by examiner

*Primary Examiner*—Lex Malsawma
(74) *Attorney, Agent, or Firm*—Fitzpatrick, Cella, Harper & Scinto

(57) ABSTRACT

Provided is a light emitting structure which can emit light having a plurality of wavelength distributions from a single light emitting structure, can be integrated at high density, and can control a radiation mode pattern of radiation light and polarization thereof. A stacked three-dimensional photonic crystal is composed of a plurality of three-dimensional photonic crystals having photonic band gaps different from one another, which are stacked. Each of the plurality of three-dimensional photonic crystals includes a resonator in which a point defect is formed.

20 Claims, 19 Drawing Sheets

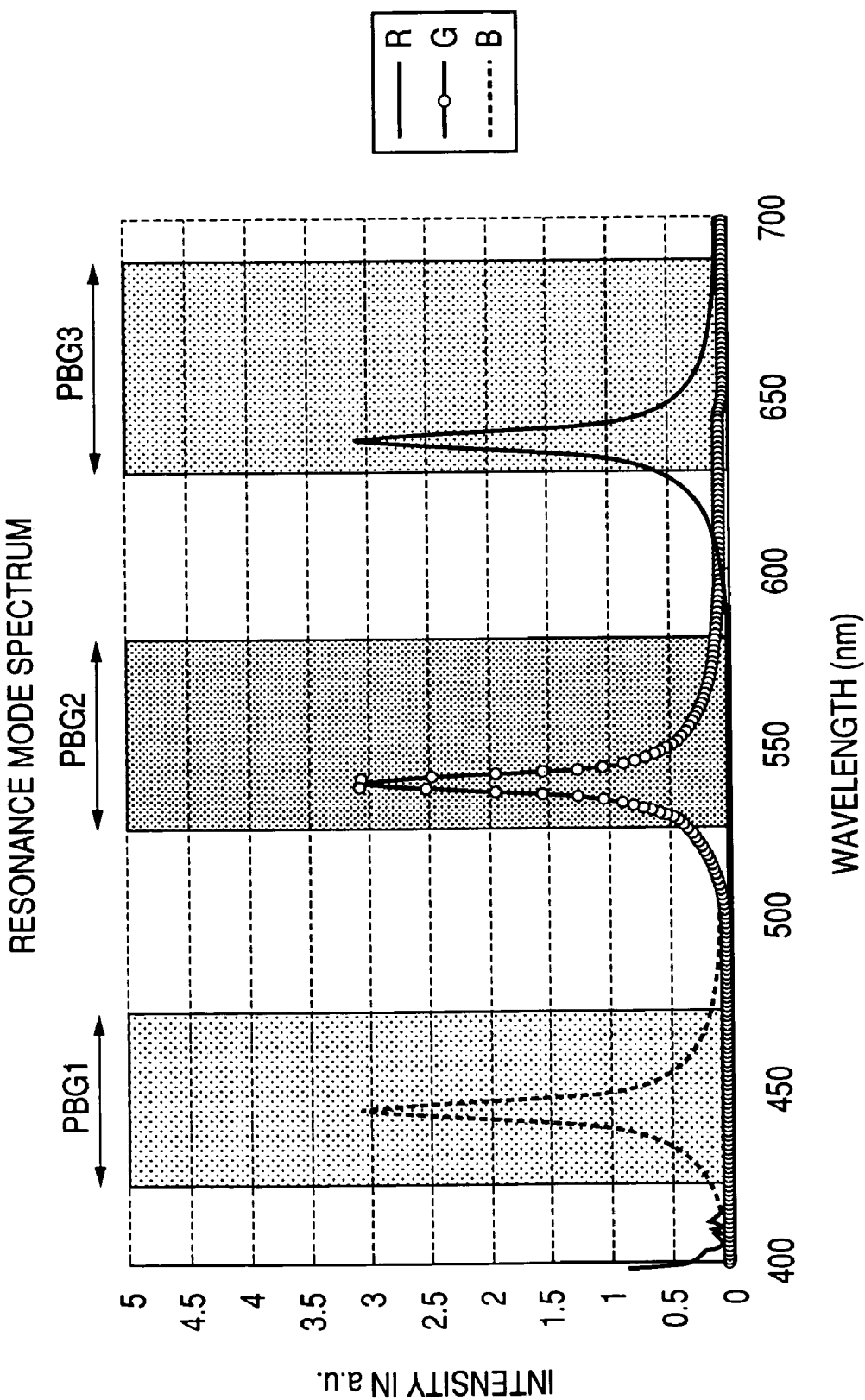

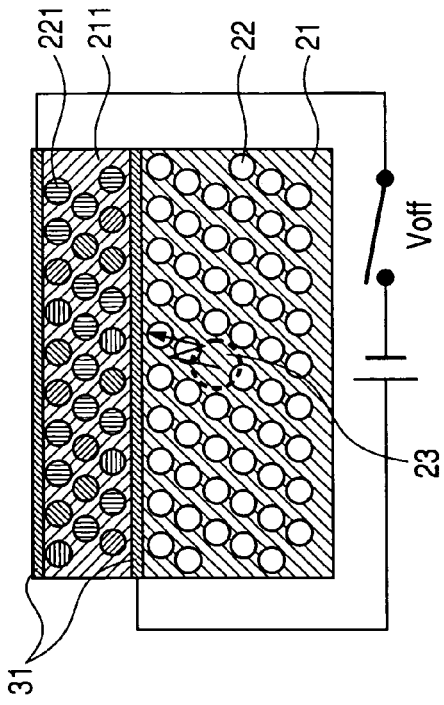
FIG. 14A1
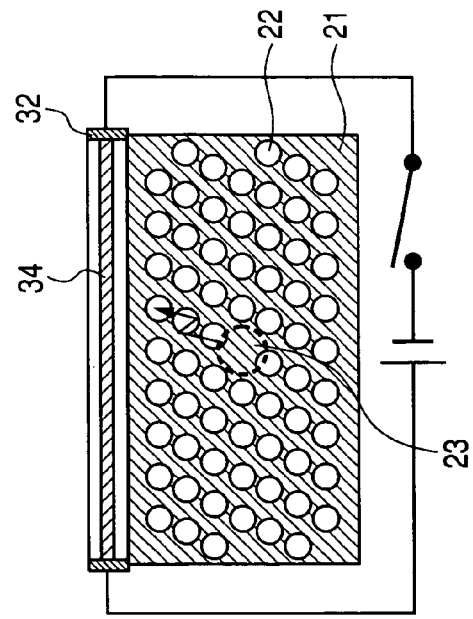
FIG. 14A2
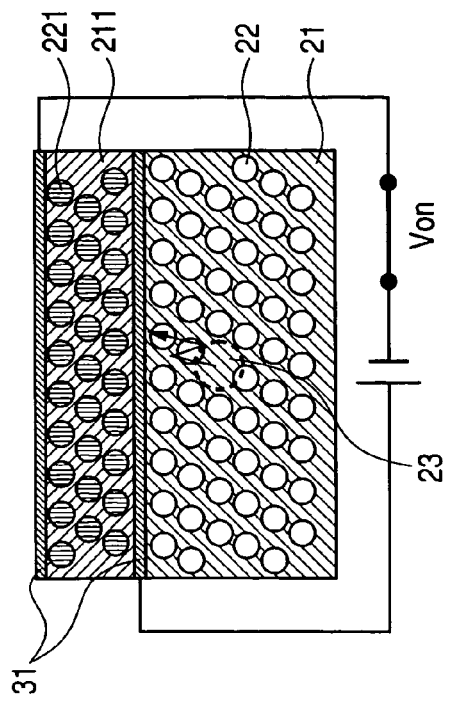
FIG. 14B
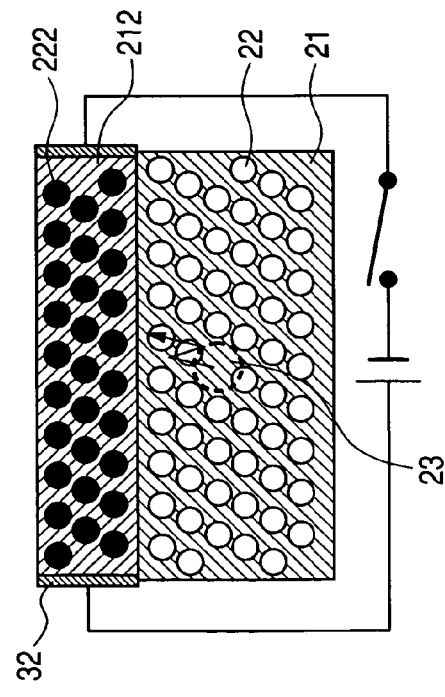
FIG. 14C

FIG. 14D1
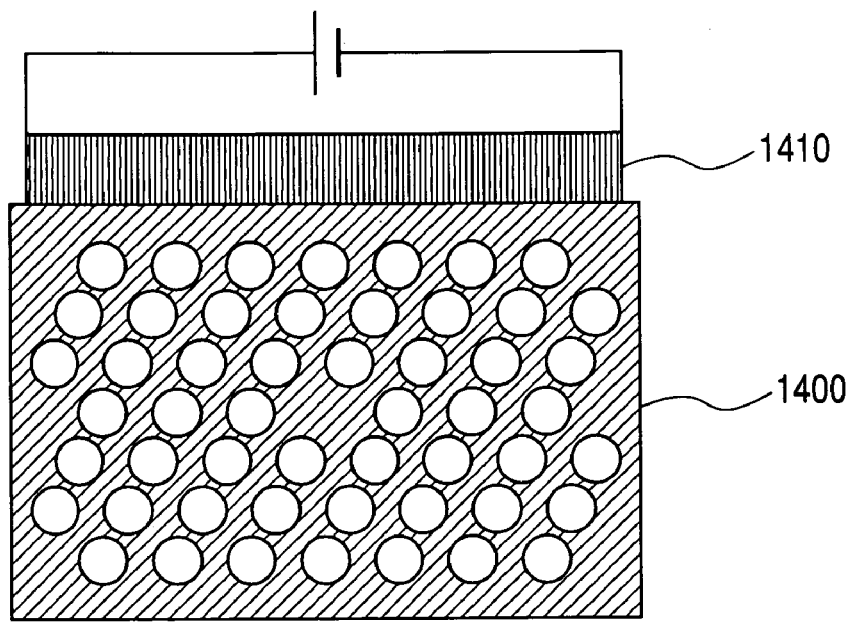
FIG. 14D2
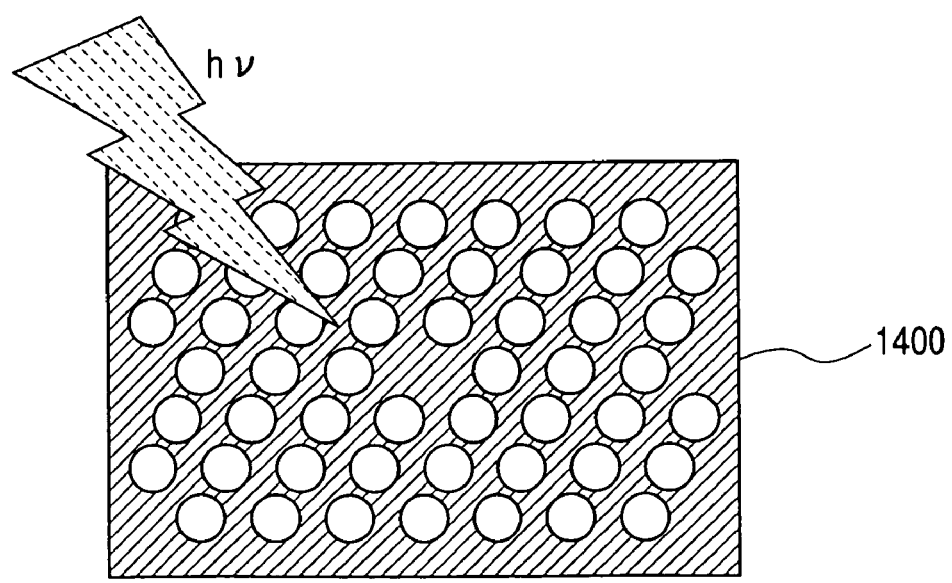

FIG. 14E1
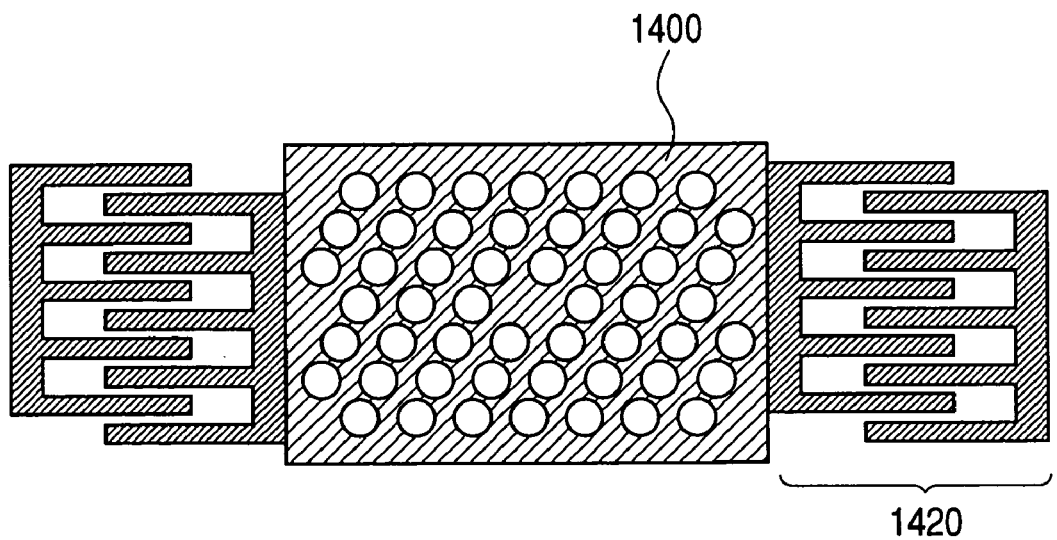
FIG. 14E2
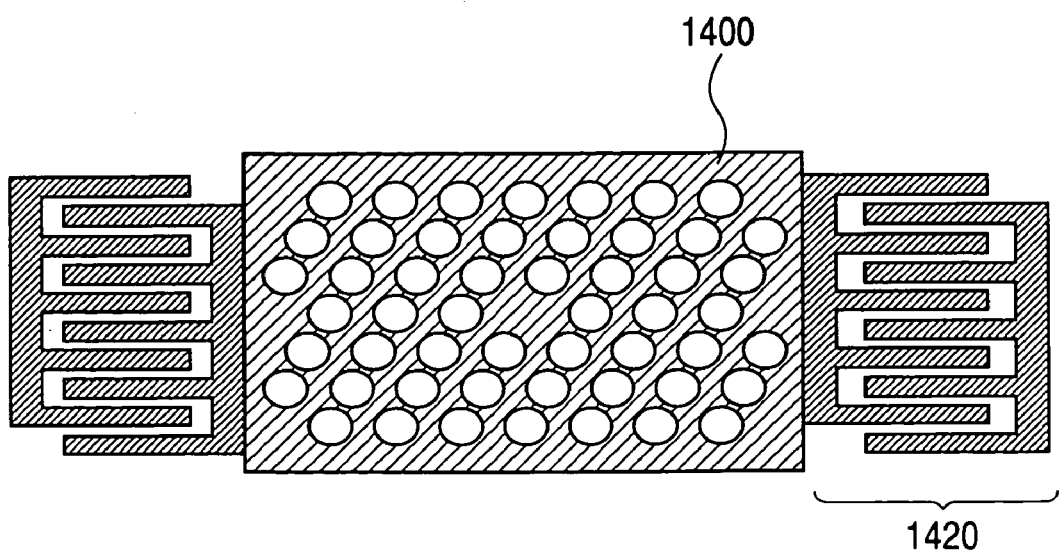

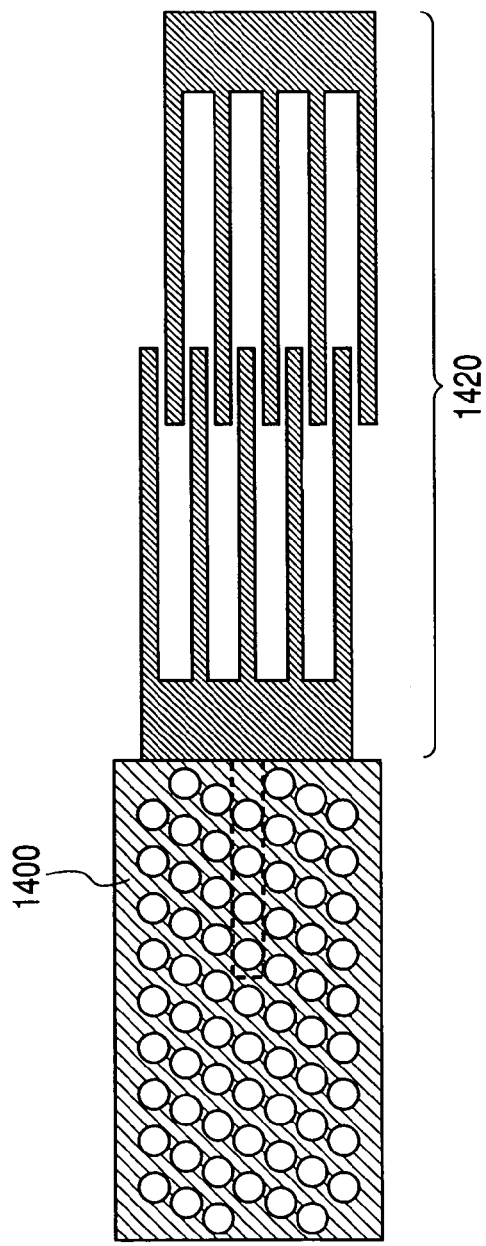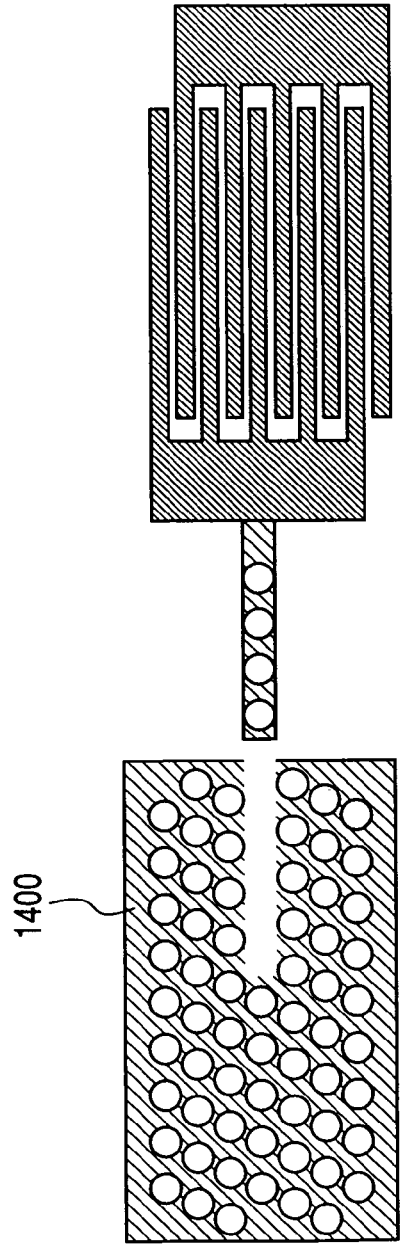

STACKED THREE DIMENSIONAL PHOTONIC CRYSTAL, LIGHT EMITTING DEVICE, AND IMAGE DISPLAY APPARATUS

BACKGROUND OF THE INVENTION

1. Field of the Invention

The present invention relates to a structure capable of selectively emitting multiple-wavelength light using a photonic crystal.

2. Related Background Art

Up to now, several methods of selectively emitting light having a predetermined wavelength have been known. Such a method is broadly classified into an active light emitting method and a passive light emitting method. With respect to the active light emitting method, there are, for example, a method using a light emitting diode and a method using plasma light emission. Light is emitted with a specific wavelength determined according to a medium to be used. A method of applying excitation energy to a fluorescent material to obtain light having a desirable wavelength has been also known. A method using a wavelength selective filter capable of transmitting only light having a specific wavelength, of light having a relatively wide wavelength region, such as white light has been known as the passive light emitting method.

In any of the above-mentioned methods, light having a predetermined wavelength distribution is emitted from a light emitting structure. Therefore, for example, when a display apparatus is to be produced using such a conventional light emitting structure, a plurality of conventional light emitting structures for emitting light having different wavelengths are arranged to compose a group, thereby expressing the entire group by an arbitrary color. Thus, for example, when a display apparatus is composed of a combination of pixels, each of which has a structure for emitting light in color of R, G, or B, it is necessary to alternately arrange the pixels, so that the resolution of an image which can be displayed thereon corresponds to ⅓ of the number of actual pixels.

Japanese Patent Application Laid-Open No. H06-283812 discloses a structure for extracting multiple-wavelength laser light from a single light emitting device. More specifically, there is disclosed a structure in which a plurality of semiconductor lasers each having a multi-layer film resonator structure is stacked to extract multiple-wavelength laser light.

On the other hand, it has been known that a photonic crystal is used for a light-emitting device. A photonic band gap (PBG) that allows almost no transmission of light having a predetermined wavelength region is used to confine light in a point defect provided in the photonic crystal, with the result that light energy can be concentrated to emit light with high efficiency (U.S. Pat. No. 5,784,400 B). When a light emitting device having a high light confining effect and high light emitting efficiency is to be realized, it is particularly effective to use a three-dimensional photonic crystal having a PBG in all directions. Such a light emitting device can be applied to various applications such as optical communications and display apparatuses, so that a structure having a wide operating wavelength band is required therefore because of its wide application range. For example, when the display apparatus is constructed, a light-emitting device for generating light having wavelengths corresponding to the wavelengths of R, G, and B which are three primary colors of light is required.

Assume that the structure in which the plurality of semiconductor lasers each having the multi-layer film resonator structure are stacked as disclosed in Japanese Patent Application Laid-Open No. H06-283812 is used to selectively extract multiple-wavelength light from the single light-emitting device. In this case, reflectance of a reflection multi-layer film is insufficient to light having a specific wavelength. Therefore, in each unit light-emitting device, high light emitting efficiency is not obtained and a heating value is likely to increase. In addition, because the reflection multi-layer film of each unit light-emitting device has predetermined reflectance to light emitted from other light emitting devices, light emission is mutually inhibited. Therefore, light-emitting efficiency becomes lower and a heating value is likely to increase. As a result, for example, when a plurality of light emitting devices, each of which can emit light having a plurality of wavelength regions are integrated to form a display apparatus, it is hard to sufficiently improve an integration density because of an increase in heating value.

In the conventional technique, the resonator structure using the reflection multi-layer film is a one-dimensional thin film structure. Therefore, it is hard to perform mode pattern control of light confined in a resonator in-plane direction.

In contrast to this, when the photonic crystal is used for the light emitting structure, it is hard to control a wavelength region of a complete photonic band gap which can be realized by the three-dimensional photonic crystal. For example, in the case of a photonic crystal having an inverse diamond opal structure (refraction index of high-refraction index material: 2.33, refraction index of low-refraction index material: 1.00, and PBG central wavelength: 550 nm), the complete photonic band gap can be obtained in only a band of about 50 nm. Therefore, it is hard to control all light corresponding to the wavelengths of R, G, and B using the single three-dimensional photonic crystal.

It has been known that the PBG widens as a difference of refraction index between a high-refraction index material and a low-refraction index material that composes the photonic crystal becomes larger. However, a material that is transparent in a visible wavelength region generally has a low refraction index, so that it is hard to obtain a wide PBG (material: refraction index, $TiO_2$: 2.3, $Ta_2O_5$: 2.1, $CeO_2$: 2.05, $ZrO_2$: 2.03, GaN: 2.4, $LiNbO_3$: 2.2, $LiTaO_3$: 2.1, and $BaTiO_3$: 2.3). The above-mentioned materials each have a lower refraction index than that of each of materials generally used in an infrared wavelength region (material: refraction index, Si: 3.4, GaAs: 3.6, and Ge: 4.0). Therefore, it is hard to realize wide band operation in the case where a use wavelength region is particularly the visible wavelength region.

SUMMARY OF THE INVENTION

A stacked three-dimensional photonic crystal of the present invention is a stacked three-dimensional photonic crystal in which a plurality of three-dimensional photonic crystals having photonic band gaps different from one another are stacked. Each of the plurality of three-dimensional photonic crystals has a resonator formed from a point defect. A light-emitting device of the present invention includes the stacked three-dimensional photonic crystal and excitation means for exciting an active medium thereof. An image display apparatus of the present invention includes a plurality of stacked three-dimensional photonic crystals which are arranged.

BRIEF DESCRIPTION OF THE DRAWINGS

FIG. 13 is a graph showing a relationship between a photonic band gap and resonant wavelength of each layer of the stacked light emitting structure;

FIGS. 14A1, 14A2, 14B, 14C, 14D1, 14D2, 14E1, 14E2, 14F1, and 14F2 are explanatory views showing means for performing light extraction switching;

DESCRIPTION OF THE PREFERRED EMBODIMENTS

Figure 1:
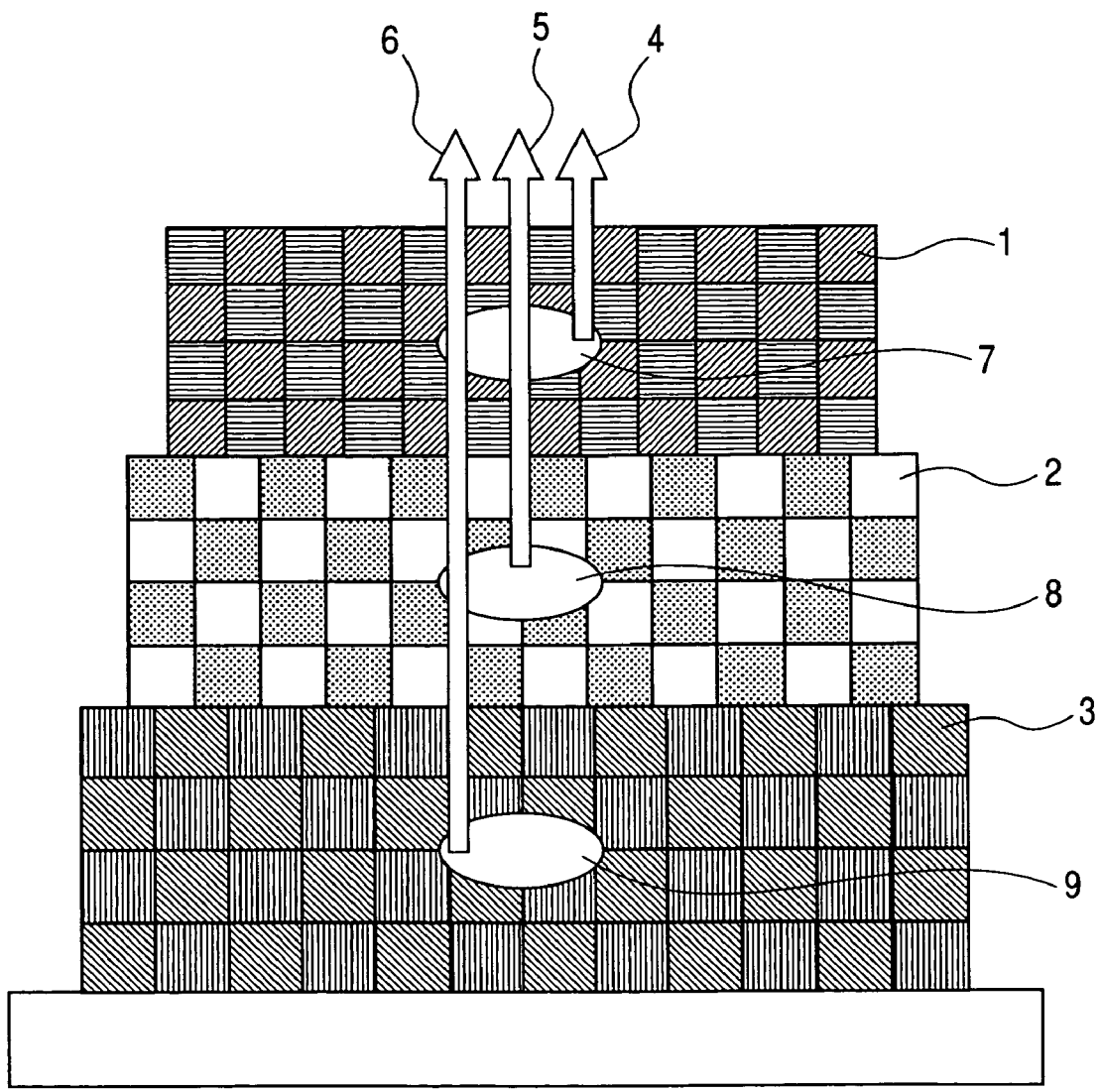
FIG. 1 is a schematic view showing a stacked light emission structure for emitting light having a plurality of wavelength distributions.

FIG. 1 is a schematic view showing a light emission structure for emitting a plurality of light beams having wavelength distributions different from one another. The light emission structure for emitting the plurality of light beams having the different wavelength distributions is obtained by stacking a plurality of three-dimensional photonic crystals (a first photonic crystal 1, a second photonic crystal 2, and a third photonic crystal 3) having photonic band gaps different from one another in a light emitting direction. The photonic crystals 1, 2, and 3 include a first resonator structure 7, a second resonator structure 8, and a third resonator structure 9, respectively, each of which serves as a light emitting region. With respect to an optical state between the plurality of photonic crystals, it is required that a structure located in an upper layer is transparent to the light. beams (a first light beam 4, a second light beam 5, and a third light beam 6) emitted from the structures located in lower layers. Therefore, the light beams from the respective lower layers transmit through the upper layers and are exited from the uppermost surface of the stacked structure. As a result, it is possible to obtain a light emitting structure in which the plurality of light beams having the different wavelength distributions are superimposed on one another and emitted there from.

For describing the present invention, the photonic crystal will be first described. It has been cleared by Yablonovitch that the photonic crystal is a structure having a predetermined periodic refraction index distribution and the behavior of light having a wavelength longer than a period of refraction index can be controlled in the photonic crystal (Physical Review Letters, Vol. 58, pp. 2059, 1987).

Figure 2:
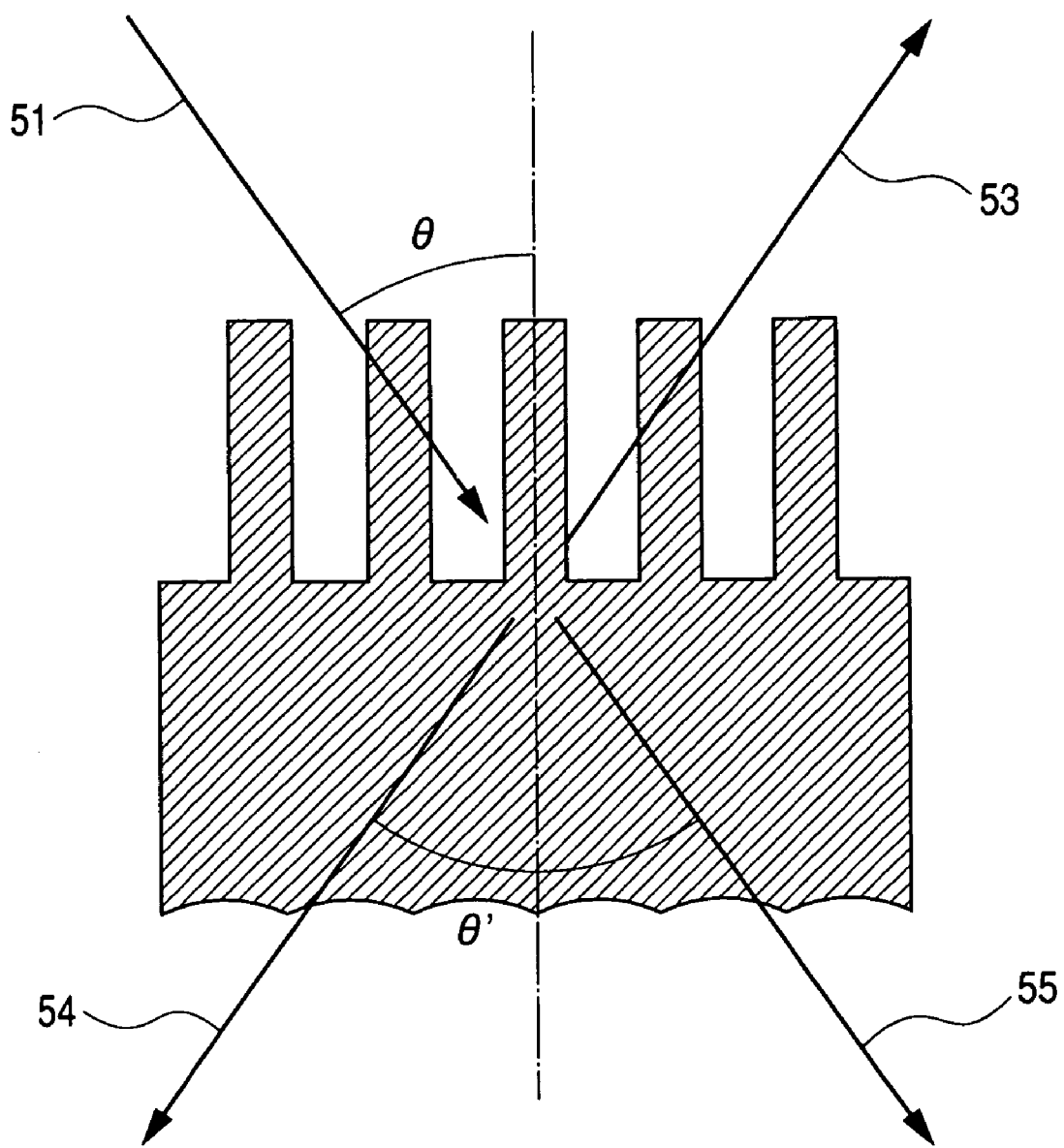
FIG. 2 is a schematic view showing diffraction caused by a diffraction grating.

FIG. 2 is a schematic view showing a state of diffraction caused by a diffraction grating. Light 51 incident on the diffraction grating is diffracted in a plurality of directions (zero-order, first-order, . . . ) determined according to a period of the diffraction grating, an incident angle θ of the light on the diffraction grating, a wavelength of the light, and the like. FIG. 2 shows, for example, zero-order reflection and diffraction light 53, positive first-order transmission and diffraction light 54, and zero-order transmission and diffraction light 55 when a diffraction angle is given by θ'. Directions of diffraction caused at this time are directions in which phases of light scattered at each point are enhanced.

Figure 3:
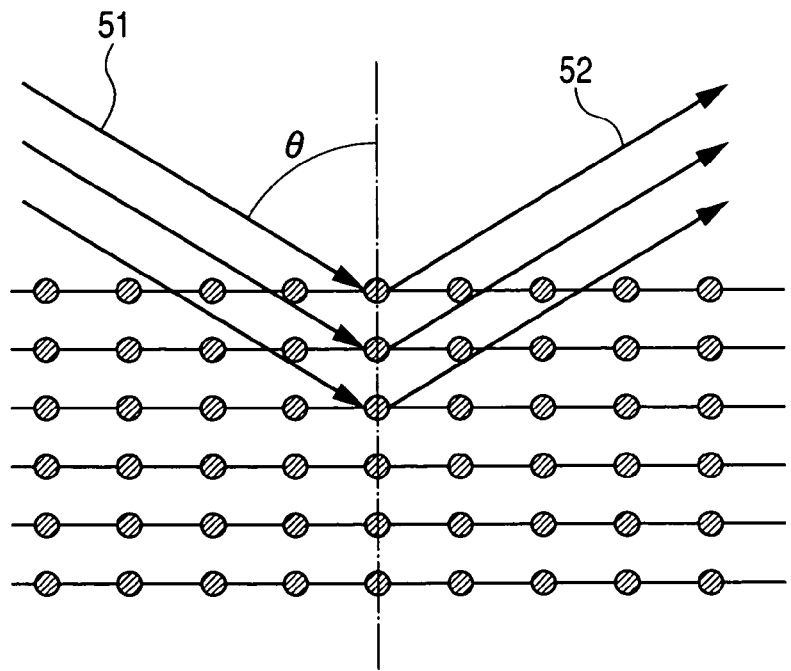
FIG. 3 is a schematic view showing diffraction on a surface of a photonic crystal.

FIG. 3 is a schematic view showing a state of diffraction on a surface of the photonic crystal. The photonic crystal has a periodic refraction index structure, which is shorter than the wavelength of the incident light. Therefore, incident light 11 is diffracted to produce diffraction light (reflection) 52. In particular, in the case of the photonic crystal, the periodic structure is used such that all enhancement directions of diffraction light caused by the periodic structure are distributed on an opposite side even when incident light having a specific wavelength is incident on the crystal in any direction. When a structure is used such that all diffraction directions of the incident light having the specific wavelength exist on the opposite side regardless of an incident angle of the incident light and no diffraction light transmitting through the surface of the crystal exists, the photonic crystal acts as a reflection mirror with respect to the light having the wavelength and is transparent to light having another wavelength.

The feature of the photonic crystal is that light having a specific wavelength region determined according to the structure thereof cannot be existed in the photonic crystal. As compared with an energy band gap of a general crystal substance, a wavelength region in which light cannot be existed in the photonic crystal is called a photonic band gap (PBG).

Figure 19A:
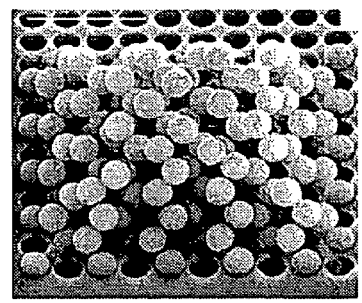
FIGS. 19A, 19B, 19C, 19D, 19E and 19F are explanatory views showing three-dimensional photonic crystal structures.
Figure 19B:
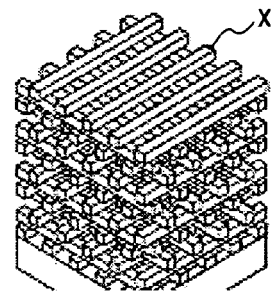
Figure 19C:
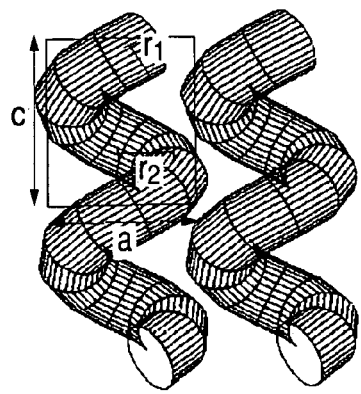
Figure 19D:
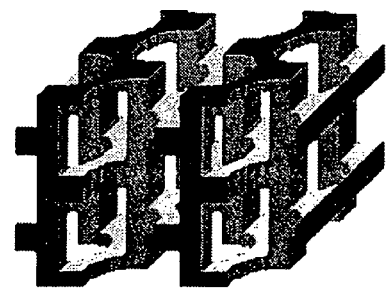
Figure 19E:
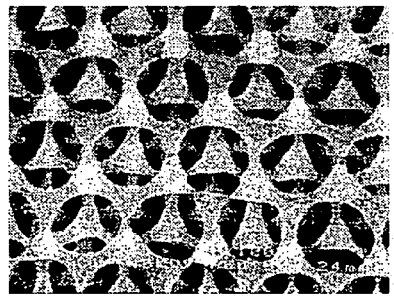
Figure 19F:
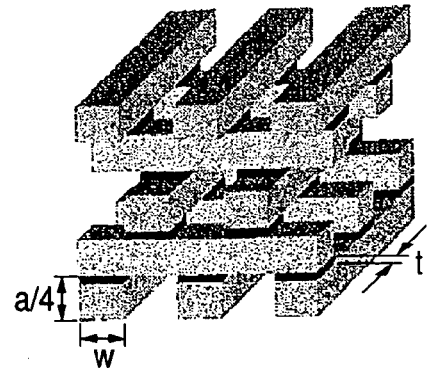

A photonic band gap obtained with respect to incident light from all directions is expressed as a complete photonic band gap. FIGS. 19A, 19B, 19C, 19D, 19E and 19F show examples of known three-dimensional photonic crystals, in each of which the complete photonic band gap is obtained. With respect to a three-dimensional structure in which the complete photonic band gap is obtained, there are diamond structures in which a high refractive index material is located at each atomic position of a diamond crystal structure in a low refractive index material (FIG. 19A: a diamond opal structure, FIG. 19E: an inverse structure, and FIG. 19F: a diamond wood pile structure). In addition, there is a woodpile structure in which columnar lattice layers composing the high refractive index material are stacked at predetermined intervals in the low refractive index material (FIG. 19B). Further, there are a spiral structure (FIG. 19C), a specific three-dimensional periodic structure (FIG. 19D), and the like. Of the three-dimensional structures such as the diamond structures, the inverse structure in which the high refractive index material is located in the low refractive index material (FIG. 19E) has a relatively wide complete photonic band gap.

When dielectric constants of the high refractive index material and the low refractive index material, a size of the structure, a period, and the like are set as appropriate for each of the three-dimensional structures, a central wavelength of the PBG and a wavelength width thereof can be determined.

On the other hand, light having a predetermined wavelength, which is existed in the photonic crystal is suppressed by the periodic refractive index structure. Therefore, a portion that the periodic refractive index structure is disturbed (point defect) is provided in the photonic crystal. As a result, an effective refractive index changes at the vicinity of the point defect, so that light can be existed in the point defect to confine the light therein.

When a shape of the point defect is suitably formed, it is possible to resonate only light having a specific wavelength. Therefore, when a structure of the point defect and a size thereof are suitably designed, an optical resonator structure which is operable at an arbitrary wavelength can be realized in the photonic crystal. Such a structure has been known as a point defect resonator structure.

The features of the point defect resonator (defect resonator structure) are that (1) light having an arbitrary wavelength within the PBG can be confined in a resonator by controlling a minute periodic structure and a point defect resonator and (2) a high-efficiency resonator can be realized based on a high efficiency reflection characteristic using the PBG. When the point defect resonator is used to produce and extract the light having the specific wavelength, it is possible to realize a light emitting structure capable of emitting the light having the arbitrary wavelength at high efficiency and a light-emitting device using the light emitting structure.

As disclosed in U.S. Pat. No. 5,784,400, the point defect resonator is provided in the photonic crystal having the complete photonic band gap and a light-emitting region is provided in the point defect resonator, so that laser oscillation can be performed by light emission made by arbitrary excitation means.

Figure 4:
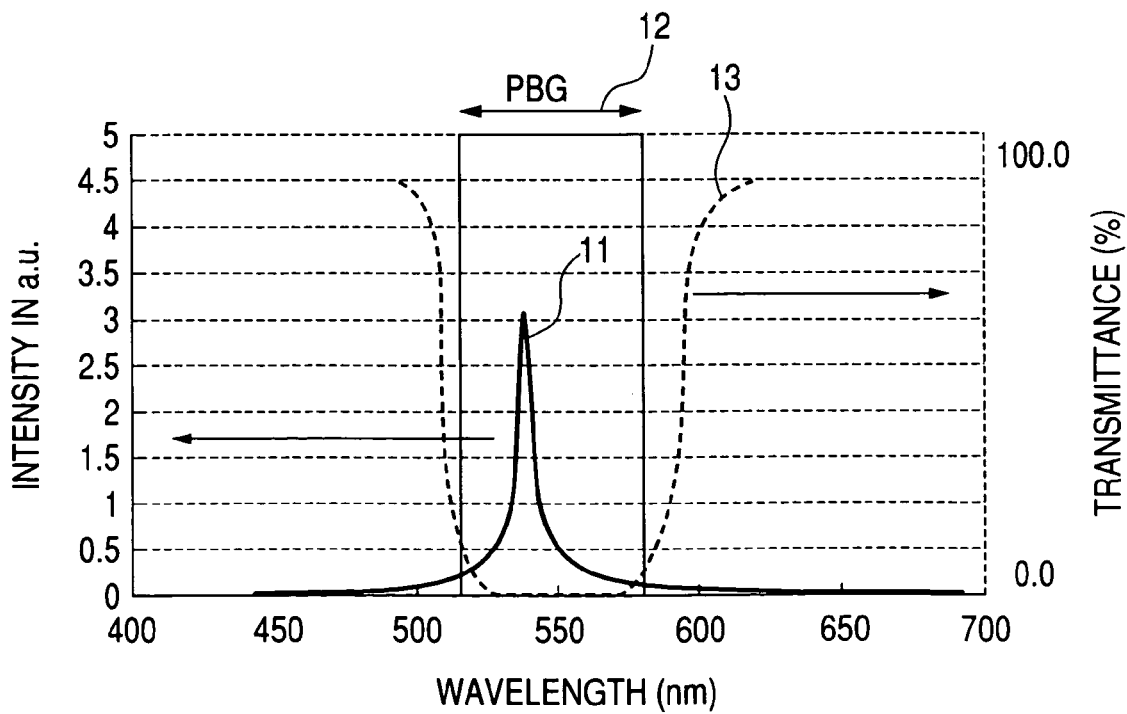
FIG. 4 is a graph showing a relationship between a PBG and a resonant wavelength.

FIG. 4 shows an example of a relationship between a photonic band gap and a resonant wavelength of a point defect resonator for resonating light having a specific wavelength in a photonic crystal. A periodic structure and a point defect resonator in the photonic crystal having characteristics shown in FIG. 4 are a structure shown in Table 1 and a structure shown Table 2, respectively.

TABLE 1

| Grating structure | Inverse diamond opal structure |
| --- | --- |
| Constituent Material 1 (refraction index) | $TiO_2$ (n = 2.33) |
| Constituent Material 2 (refraction index) | Air or Vacuum (n = 1.00) |
| lattice period | a = 365 nm |
| Radius of Constituent Material 2 | 0.30a |

TABLE 2

| Shape of point defect resonator | Substantial sphere |
| --- | --- |
| Material of a point defect resonator (refraction index) | $TiO_2$ (n = 2.33) |
| Resonator diameter (effective value) | 231.7 nm |

The point defect resonator is obtained by filling air located at lattice points as point defects with $TiO_2$ (refraction index=2.33).

As shown in FIG. 4, the photonic crystal acts as a reflection mirror with respect to the light having the specific wavelength, so that transmittance 13 thereof can be substantially reduced to zero. A wavelength region that the transmittance 13 of the photonic crystal becomes substantially zero is a photonic band gap (PBG) 12. On the other hand, it is necessary to reflect light having the resonant wavelength of the point defect resonator in the photonic crystal. Therefore, as shown in FIG. 4, the resonant wavelength is present in the photonic band gap 12.

As shown in FIG. 4, the photonic crystal with the periodic structure has the photonic band gap in a wavelength band of 525 nm to 575 nm and reflects light having the wavelength region. In the point defect resonator, it is possible to resonate light having a wavelength close to 540 nm which is within the photonic band gap.

A structure and a material of the photonic crystal that has the point defect resonator to resonate the light having the specific wavelength are not limited to the above-mentioned ones. Therefore, it is possible to suitably determine a structure and a material which are capable of obtaining the point defect resonator having the resonant wavelength within the photonic band gap.

When a light emitting structure capable of selectively emitting light having plurality of wavelengths is to be obtained using the photonic crystal and the point defect resonator included therein, it is required that at least a portion located in the upper layer be transparent to light emitted from a structure located in the lower layer.

Figure 5:
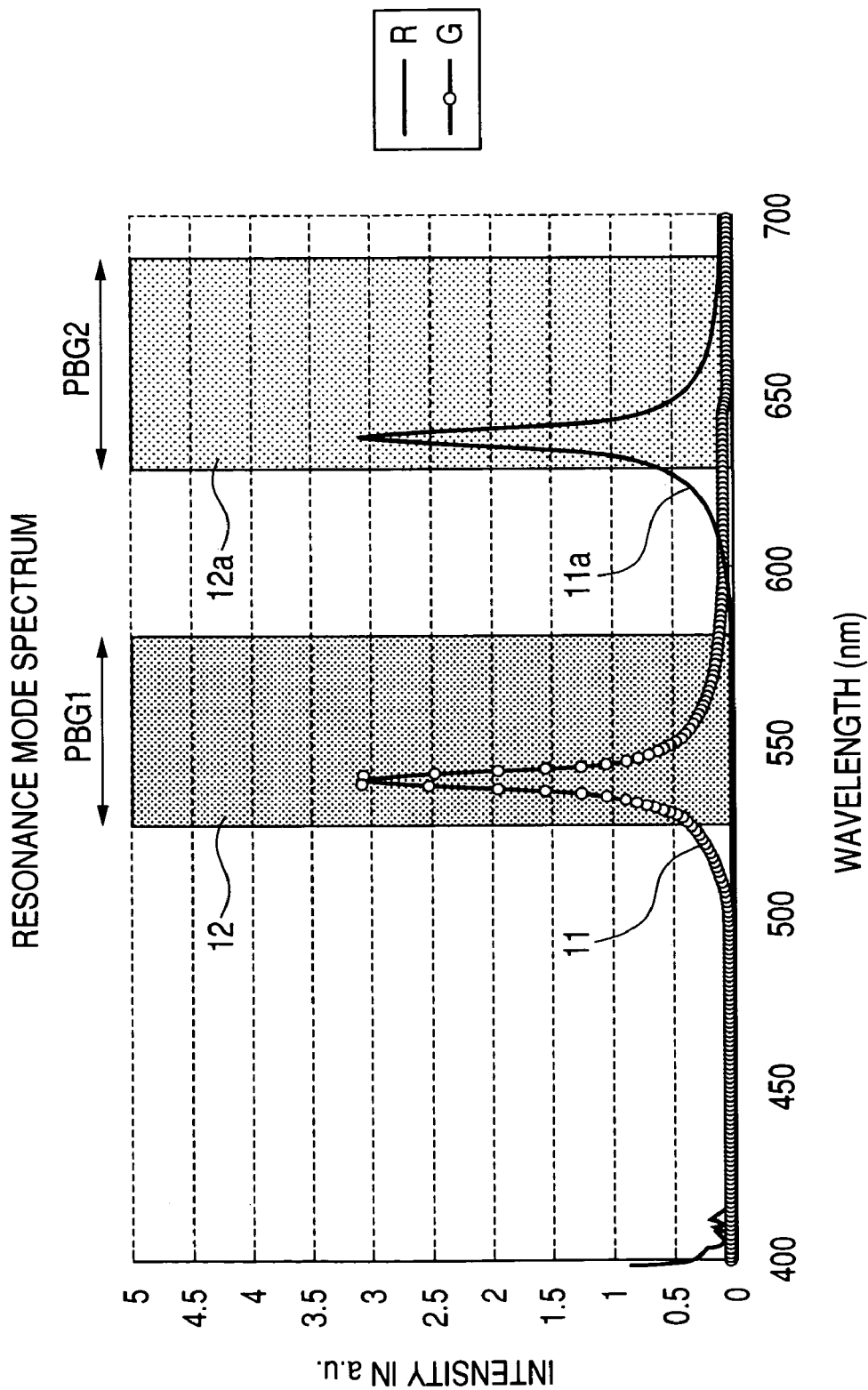
FIG. 5 is a graph showing a relationship between a PBG and a resonant wavelength with respect to two kinds of photonic crystals.

FIG. 5 is a graph showing a relationship between a photonic band gap and a resonant wavelength with respect to two kinds of photonic crystals having different point defect resonators. Periodic refraction index structures and point defect resonators in first and second photonic crystals having characteristics shown in FIG. 5 are structures shown in Table 3 and structures shown Table 4.

TABLE 3

|  | First photonic crystal | Second photonic crystal |
| --- | --- | --- |
| Grating structure | Inverse diamond opal structure | Inverse diamond opal structure |
| High refraction index material (refraction index) | $TiO_2$ (n = 2.33) | $TiO_2$ (n = 2.33) |
| Low refraction index material (refraction index) | Air or vacuum (n = 1.00) | Air or vacuum (n = 1.00) |
| Lattice period | a = 365 nm | a = 432 nm |
| Radius of low refractive index material (air) | 0.30a | 0.30a |
| PBG wavelength | 525 nm to 575 nm | 625 nm to 685 nm |

TABLE 4

|  | First photonic crystal | Second photonic crystal |
| --- | --- | --- |
| Shape of a point defect resonator | Substantial sphere | Substantial sphere |
| Material of a | $TiO_2$ (n = 2.33) | $TiO_2$ (n = 2.33) |

TABLE 4-continued

| | First photonic crystal | Second photonic crystal |
| --- | --- | --- |
| point defect resonator (refraction index) | | |
| Resonator diameter (effective value) | 231.7 nm | 274.7 nm |
| Central resonant wavelength | 540 nm | 640 nm |

In any photonic crystal, each of the point defect resonators shown in Table 4 is obtained by filling low refraction index materials (air) located at lattice points as point defects with media (n=2.33).

When a lattice period the photonic crystal is changed as shown in Table 3, it is possible to shift photonic band gaps 12 and 12a as shown in FIG. 5.

As described above, when the photonic crystals having the photonic band gaps which are not overlapped with each other are stacked, the light emitting structure capable of selectively emitting the light having the plurality of wavelengths can be obtained without blocking light emitted from the respective photonic crystals. In addition, when the effective diameter of the point defect resonator is changed as shown in Table 4, the resonance wavelength can be shifted within the photonic band gap.

When light emission caused by resonating the light having the specific wavelength by the point defect resonator in the photonic crystal is to be used, it is necessary to extract a part of the resonated light from the photonic crystal to the outside.

Figure 6:
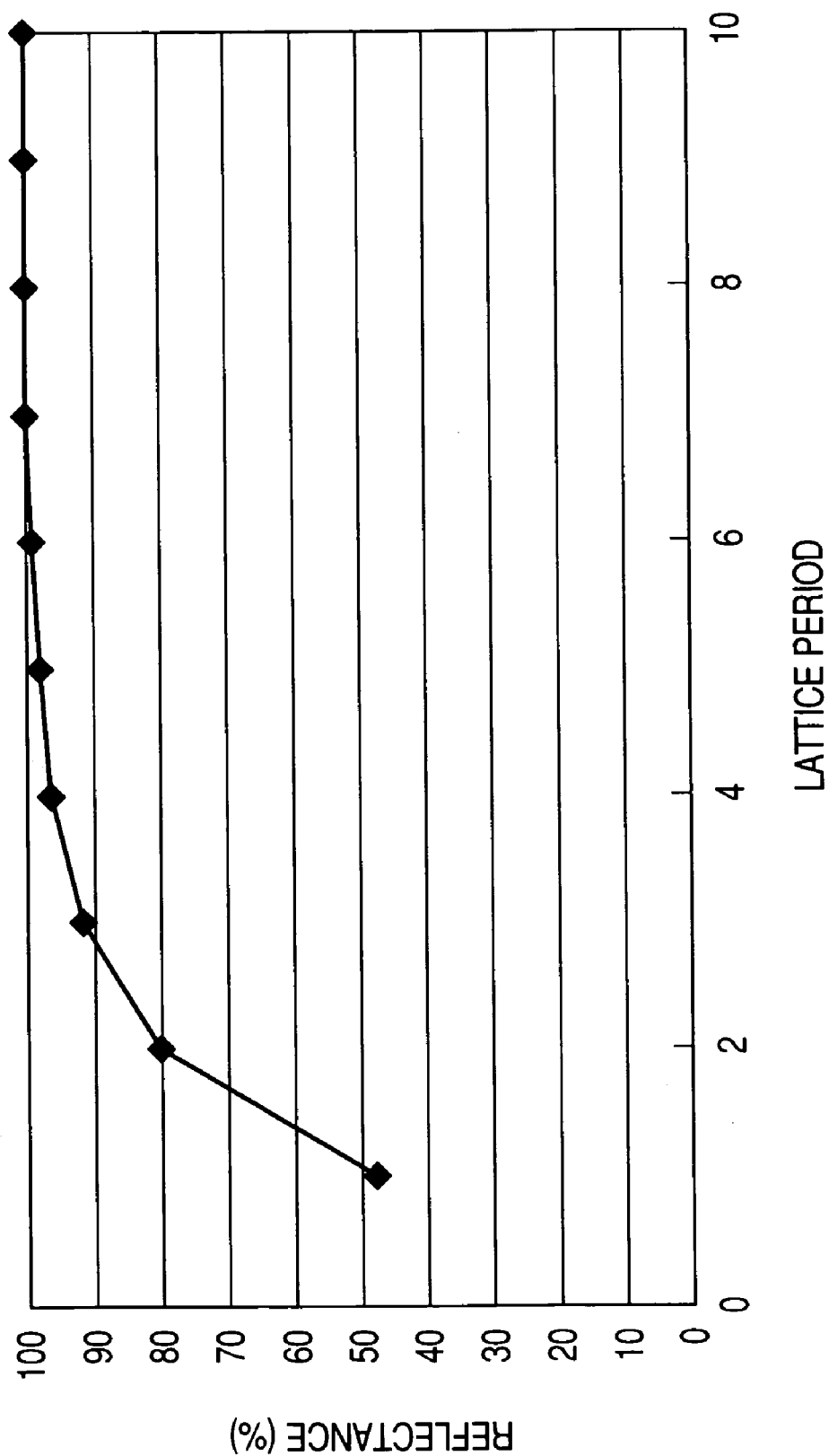
FIG. 6 is a graph showing a relationship between a lattice period and reflectance of a photonic crystal.

FIG. 6 is a graph showing a relationship between a period of a three-dimensional photonic crystal and reflectance in a photonic band gap. The horizontal axis indicates a period of the crystal as a unit. When a thickness of the three-dimensional photonic crystal is equal to about several periods, a certain percentage of light transmits there through. Therefore, when the photonic crystal including the point defect resonator is thinned to the extent that a certain percentage of light transmits there through, light can be extracted from the point defect resonator.

Figure 7A:
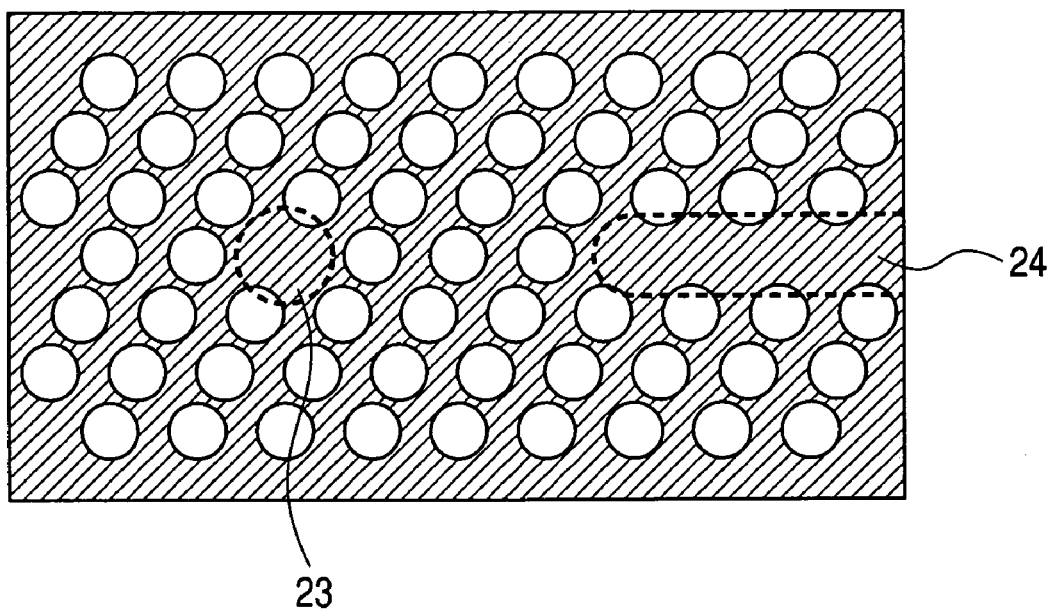
FIGS. 7A and 7B are explanatory views showing means for extracting light from a point defect resonator.
Figure 7B:
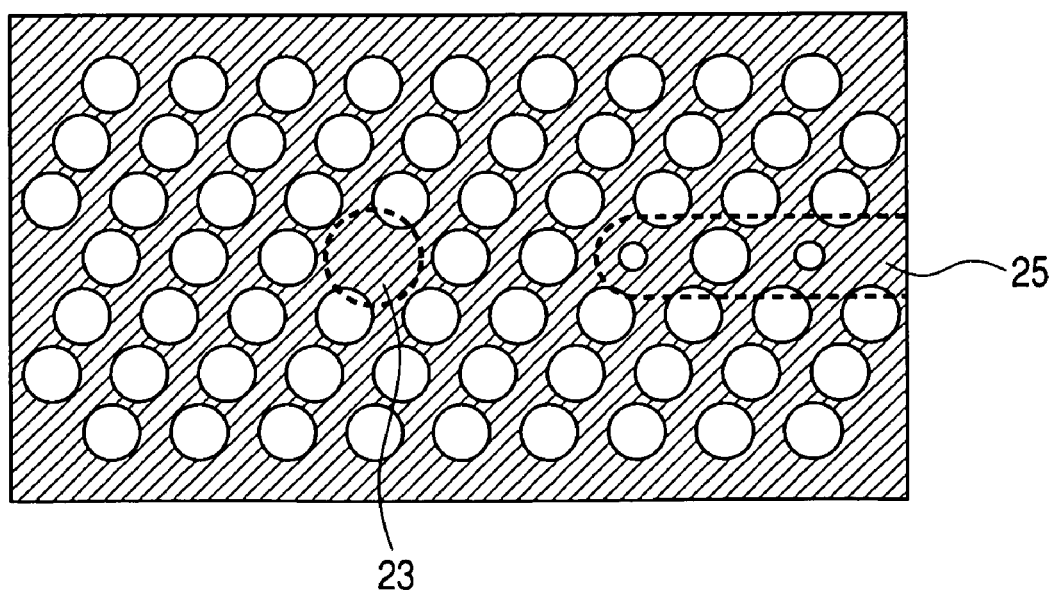

FIGS. 7A and 7B show other structures for extracting light from a point defect resonator 23 in photonic crystals. A part of the photonic crystals including the point defect resonator is irregularly formed to obtain a waveguide. Therefore, light can be extracted through the waveguide. Various waveguide such as a linear defect waveguide 24 having a guided mode including a wavelength to be extracted and a point defect coupling waveguide 25 can be used for the waveguide.

With respect to an excitation method of exciting a light emitting medium of the point defect resonator to emit light, there are optical excitation using an external light source, excitation using current injection, and the like. In the case of the excitation using current injection, when a metallic material such as Al or Cr or a transparent conductive material such as an ITO is used for electrodes, the light-emitting medium can be sandwiched between the electrodes to emit light. In addition, when electrodes which are separately operated are formed for a plurality of point defect resonators, it is possible to separately control light having respective wavelengths.

Figure 8:
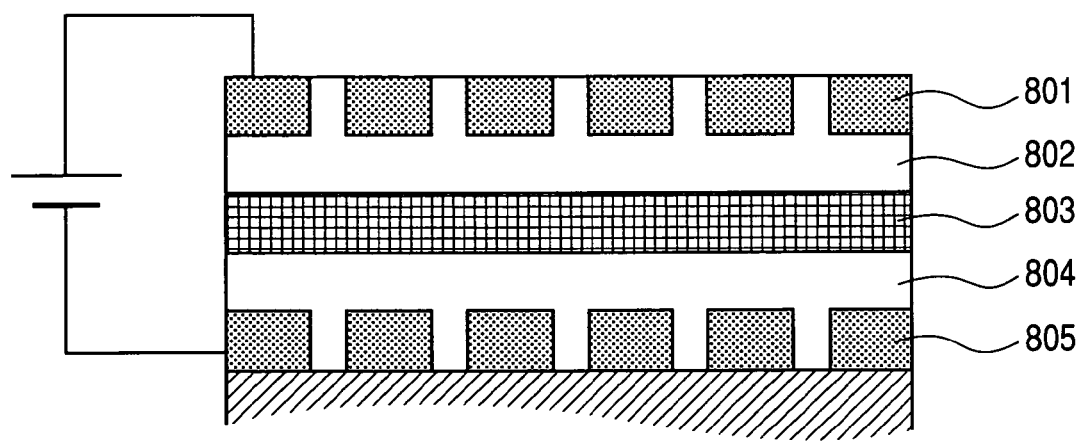
FIG. 8 is a schematic view showing a light emitting structure in which an inorganic light emitting material is used as a light emitting material.

FIG. 8 shows an example of a light emitting structure in which an inorganic light emitting material is used as a light emitting material. In this light emitting structure, a light emitting layer 803 made of an inorganic light emitting material is sandwiched by upper and lower insulating layers 802 and 804. Electrodes 801 and 805 are provided so as to sandwich the light-emitting layer 803 and the upper and lower insulating layers 802 and 804. Therefore, it is possible to produce a light-emitting portion that emits light having a wavelength determined according to a light emitting material. When such a light-emitting portion is provided in the point defect resonator, light having a wavelength determined by the point defect resonator can be resonated for extraction. It is desirable to use a transparent material such as an indium tin oxide (ITO) for the electrodes. A metal such as Al or Cr may be used for the electrode. ZnS:Mn, ZnMgS:Mn, ZnS:Sm, ZnS:Tb, ZnS:Tm, CaS:Eu, SrS:Ce, SrS:Cu, SrGa$_2$S$_4$:Ce, BaAl$_2$S$_4$:Eu, or the like can be used as an example of the inorganic light emitting material. SiO$_2$, SiN, Al$_2$O$_3$, Ta$_2$O$_5$, SrTiO$_3$, or the like can be used for the insulating layers. The inorganic light emitting material and the insulating material are not limited to those. When a structure that causes light emission by current injection is obtained, other materials can be used. A light-emitting structure using the inorganic light emitting material may be a structure other than that shown in FIG. 8.

Figure 9:
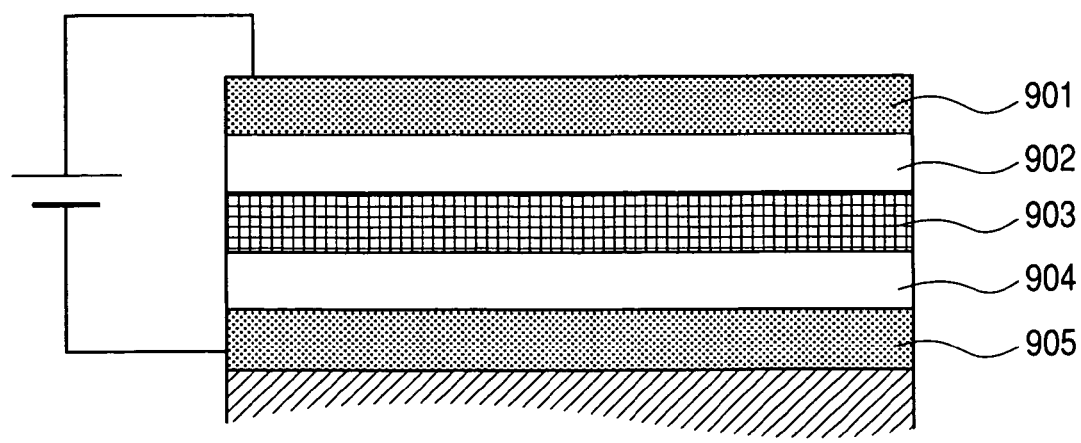
FIG. 9 is a schematic view showing a light emitting structure in which an organic light emitting material is used as the light emitting material.

FIG. 9 shows an example of a light-emitting structure in which an organic light emitting material is used as the light-emitting material. In this light-emitting structure, a light-emitting layer 903 containing an organic light-emitting material is sandwiched by an electron transporting layer 902 and a hole transporting layer 904. Upper and rear electrodes 901 and 905 are provided so as to sandwich the light-emitting layer 903, the electron transporting layer 902, and the hole transporting layer 904. Therefore, a light-emitting structure for emitting light having a wavelength determined according to a light-emitting material is obtained. There is a structure including the electron-injected layer and the hole injected layer, other than such a structure. It is desirable to use a transparent electrode material such as an indium tin oxide (ITO) for the upper electrode 901 through which light caused by light emission transmits. An indium tin oxide (ITO) or a metal such as Al or Cr, which is not transparent, can be used for the rear electrode 905.

Alq, Eu(DBM)3(Phen), BeBq, DPVBi, or the like may be used as a typical low-molecular organic light emitting material. TPD, α-NPD, TPT, or Spiro-TPD may be used as a typical hole transporting low-molecular material. PBD, TAZ, OXD, or Bphen may be used as a typical electron transporting low-molecular material. A conductive polymer using polythiophene, polyaniline, or the like, which is doped with acid such as polystyrene sulfonate or camphor sulfonate may be used as a typical polymer organic light emitting material for the light emitting layer. Various materials other than the above-mentioned materials can be used.

In addition to the structures shown in FIGS. 8 and 9, a current injection type light-emitting structure is provided in the point defect resonator by using a light-emitting medium including a compound semiconductor material, an inorganic light-emitting material, an organic light-emitting material, a polymer light-emitting material, a quantum dot, and a nanocrystal. Therefore, light having a desirable wavelength can be resonated for extraction.

Figure 10:
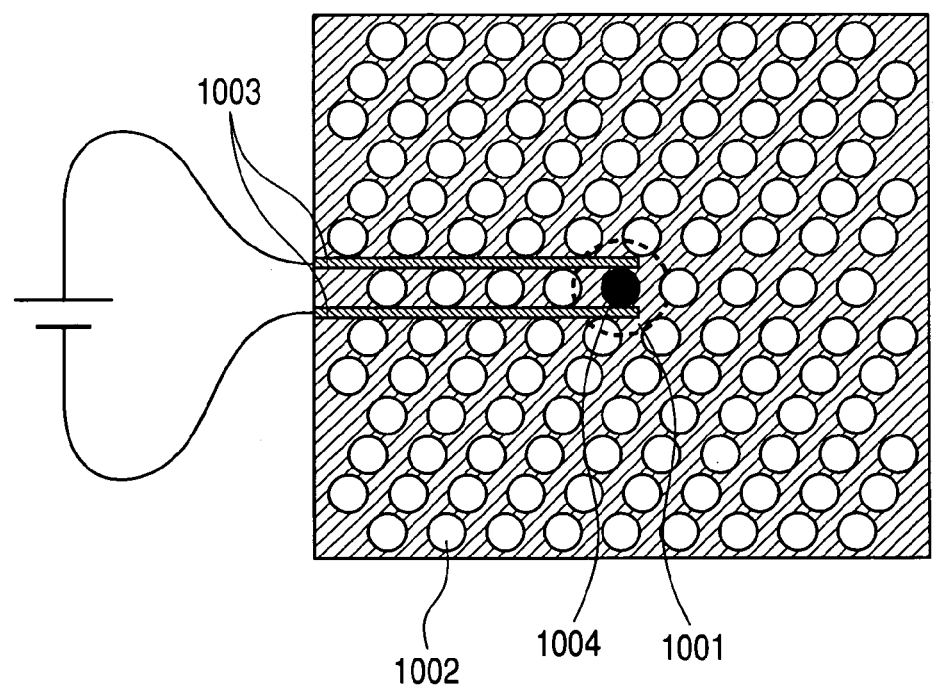
FIG. 10 is a schematic view showing a light emitting structure in which a conductive transparent electrode material is used for a current injection electrode.

FIG. 10 shows a structural example in the case where a conductive transparent electrode material such as an ITO is particularly used as a current injection electrode material. When an ITO or the like is used as the current injection electrode material, it is possible to obtain a simple structure in which the waveguide for extracting light from the point defect resonator in the photonic crystals is also served for current injection electrodes. A current is injected for light emission into a light emitting material 1004 which is inserted into a point defect resonator 1001 using transparent electrodes 1003 passing through photonic crystals 1002. At this time, the transparent electrodes 1003 become line defects to a period of the photonic crystal 1002. In addition, the transparent electrodes 1003 become the waveguide. Therefore, a part of light resonated by the point defect resonator 1001 is guided to the outside of the photonic crystals through the transparent electrodes 1003.

When the optical excitation is caused using the external light source, a wavelength outside the photonic band gap is used, with the result that the light-emitting medium in the photonic crystals can be efficiently excited for light emission.

Figure 11:
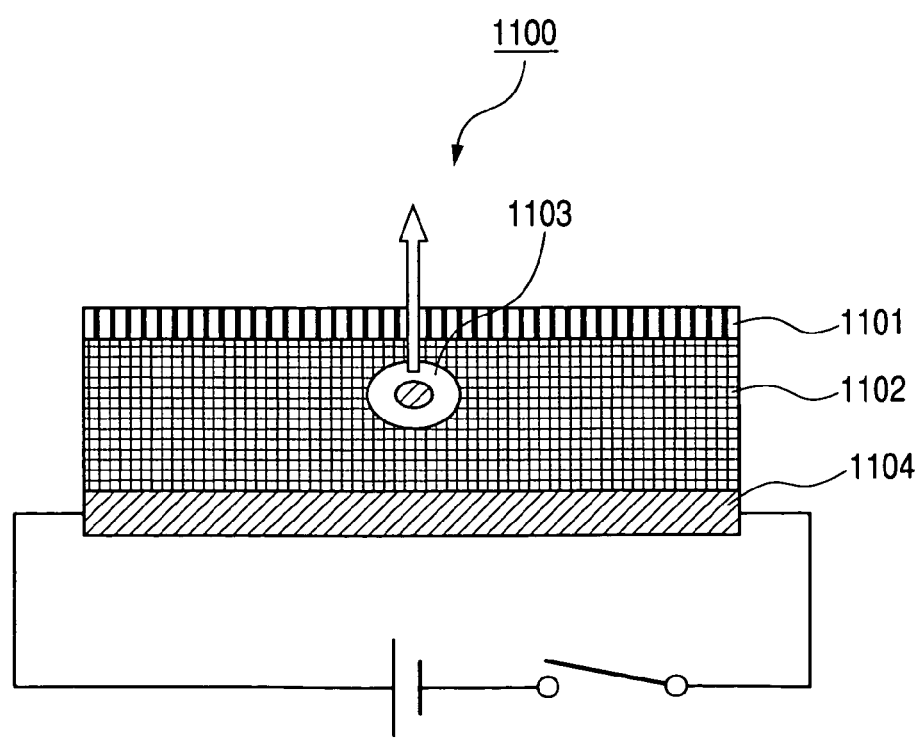
FIG. 11 is a schematic view showing an optical excitation light emitting structure.

FIG. 11 shows an example of a light-emitting structure 1100 in the case where the light-emitting layer is optically excited using the external light source. A resonator 1103 containing a fluorescent material that emits fluorescent light having a wavelength within the PBG is provided in the photonic crystals 1102. In order to excite the fluorescent material of the resonator structure 1103 for light emission, an ultraviolet light source 1104 that emits light having a wavelength shorter than the PBG of the photonic crystals 1102 is provided below the photonic crystals 1101. A wavelength selective filter 1101 that transmits light emitted from the resonator 1103 and cuts off only excitation light emitted from the ultraviolet light source 1104 is provided on the photonic crystals 1102.

According to the structure shown in FIG. 11, when an ON/OFF state of the ultraviolet light source 1104 is controlled by a control circuit which is externally provided, it is possible to control an output of light which is resonated by the resonator 1103 and emitted to an upper side of the light emitting structure. When such a structure is used, it is unnecessary to form, for example, the current injection electrodes in the photonic crystals 1102. Therefore, it is possible to obtain a light emitting structure using a photonic crystal having a more complete PBG. When light having a plurality of wavelengths is to be arbitrarily selectively emitted from the light emitting structure having the plurality of photonic crystals, a switching mechanism for freely selecting ON/OFF of emission of light from each unit light emitting structure is required.

With respect to a mechanism for switching between ON/OFF of light emission caused by each photonic crystal, there are a method of switching between ON/OFF of emission of light from the light emitting medium and a method of switching between ON/OFF of extraction of light from the point defect resonator (or unit light emitting structure). When the excitation is caused by the current injection, the ON/OFF of light emission can be switched with a relatively high response. Therefore, it is preferable to perform switching according to an injected current. On the other hand, when the optical excitation is caused using the external light source, it is preferable to perform switching of extraction of light from the point defect resonator or the photonic crystal while the emission of light from the light-emitting medium continues.

Next, a method of producing a three-dimensional photonic crystal will be described. When a structure located at each lattice point is sphere as in the case of the diamond opal structure, the three-dimensional photonic crystal can be produced by suitably stacking a member made of a predetermined material on a three-dimensional lattice structure. In the case of the inverse structure in which a dielectric constant of a member located at a lattice point is higher than that of each of other members located around the member and particularly the member located at the lattice point is made of a low-refraction index material, the following method has been known. First, a three-dimensional lattice structure (such as a face centered cubic structure or a diamond opal structure) is obtained using silica spheres and polymer spheres. Then, a gap between the spheres is filled with a lattice material such as a dielectric material. Finally, the silica spheres and the polymer spheres are removed. With respect to a lattice material filling method, there are a sol-gel method and a nanoparticle filling method, and the like. With respect to a method of removing the silica sphere and the polymer sphere, there are a dissolving method using a solvent and a removal method with baking.

On the other hand, in the cases of the woodpile structure and the like, each layer thereof can be formed by application of a general semiconductor process including lithography, film formation, and etching. When a crystal structure having a large number of layers is to be obtained, a predetermined number of pile structures are obtained by the general semiconductor process and then a process for bonding the pile structures to each other using a wafer bonding method is repeated.

Hereinafter, stacked three-dimensional photonic crystal structures according to embodiments of the present invention, which is produced by the above-mentioned technique will be described.

Embodiment 1

Figure 12:
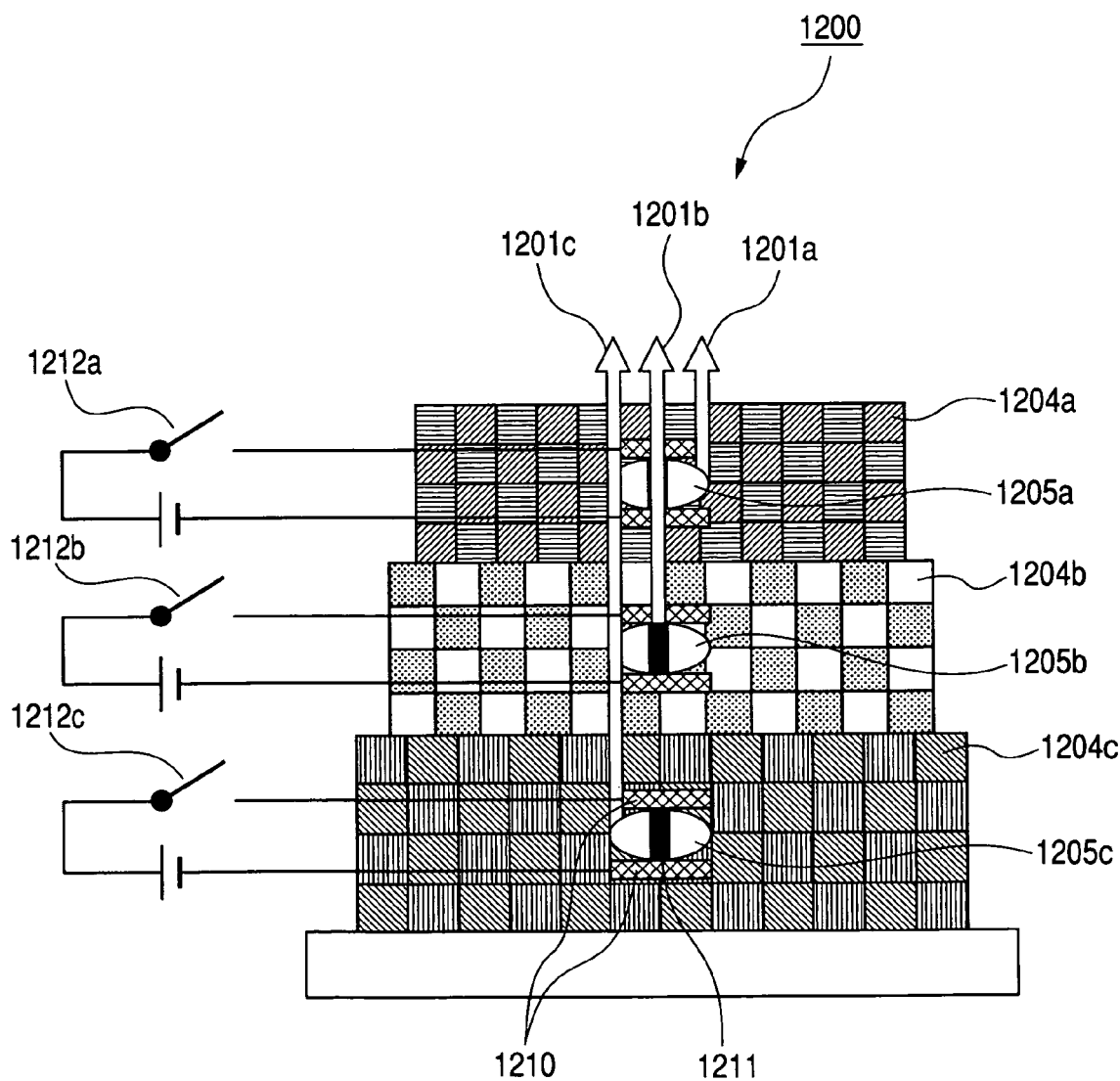
FIG. 12 is a schematic view showing a stacked light emitting structure using a current injection light emitting structure.

FIG. 12 is a schematic view showing a stacked light-emitting structure of a current injection excitation type. Three photonic crystal layers that resonate light beams 1201*a* to 1201*c* having wavelengths different from one another and emit the light beams are stacked. Each of the photonic crystals has a light-emitting region that includes a point defect resonator and a light emitting medium. Tables 5 and 6 show photonic crystal structures 1204*a* to 1204*c* and point defect resonators 1205*a* to 1205*c*.

TABLE 5

|  | First photonic crystal structure | Second photonic crystal structure | Third photonic crystal structure |
| --- | --- | --- | --- |
| Grating structure | Inverse diamond opal structure | Inverse diamond opal structure | Inverse diamond opal structure |
| Constituent Material 4 (refraction index) | $TiO_2$ (n = 2.33) | $TiO_2$ (n = 2.33) | $TiO_2$ (n = 2.33) |
| Constituent Material 5 (refraction index) | Air or vacuum (n = 1.00) | Air or vacuum (n = 1.00) | Air or vacuum (n = 1.00) |
| Lattice period | a = 300 nm | a = 365 nm | a = 432 nm |
| Radius of constituent Material 5 | 0.30a | 0.30a | 0.30a |
| Band gap region | 428 nm to 476 nm | 521 nm to 579 nm | 617 nm to 686 nm |

TABLE 6

|  | First resonator structure | Second resonator structure | Third resonator structure |
| --- | --- | --- | --- |
| Shape of defect | Substantial sphere | Substantial sphere | Substantial sphere |

TABLE 6-continued

|  | First resonator structure | Second resonator structure | Third resonator structure |
|---|---|---|---|
| resonator Material of defect resonator (refraction index) | $TiO_2$ (n = 2.33) | $TiO_2$ (n = 2.33) | $TiO_2$ (n = 2.33) |
| Resonator diameter (effective value) | 190.4 nm | 231.7 nm | 274.7 nm |
| Central resonant wavelength | 443 nm | 540 nm | 640 nm |

In this embodiment, light emission is caused from the structure using the inorganic light emitting material for each light-emitting region 1211 as shown in FIG. 8. A current is injected from the outside to the light-emitting region provided in the resonator of each of the layers through electrodes 1210. Therefore, light having a specific wavelength can be generated.

There are the following existing light-emitting materials. When a rare-earth ion as light-emitting center is added to a material such as ZnS, CaS, or SrS, which is used as a host, an EL material that emits light having various wavelengths is obtained. For example, in the case of red, there have been known $ZnS:Sm^{3+}$ in which $Sm^{3+}$ is added to ZnS used as a host and $CaS:Ce^{3+}$. In the case of green, $ZnS:Tb^{3+}$ and $SrS:Ce^{3+}$ have been known. In the case of blue, $ZnS:Tm^{3+}$ and $SrS:Cu^+$ have been known. In order to cause the light emission using those inorganic light-emitting materials, for example electroluminescence can be used. For example, a light-emitting layer is sandwiched by insulating layers, electrodes are located to sandwich the light-emitting layer and the insulating layers, and a high electric field is stably applied to the light-emitting layer. Therefore, light emission can be caused by electric field excitation. In addition to the above-mentioned materials, a light emitting medium including a compound semiconductor material, an organic light-emitting material, a polymer light-emitting material, a quantum dot, and a nanocrystal may be used.

When the number of photonic crystal layers located above each of the resonators is reduced to a value smaller than the number of photonic crystal layers located below the corresponding resonator, resonated light is emitted to only the upper side. The structure of the light-emitting region is not limited to this and thus a suitable structure can be used for applications.

FIG. 13 shows a relationship between a photonic band gap and a resonant wavelength of each of the layers of the stacked light-emitting structure according to this embodiment. The respective layers are designed so as to emit light having wavelengths corresponding to general colors of R, G, and B. The photonic band gap (PBG) of the photonic crystal composing one of the layers is formed so as not to include the wavelengths of light emitted from the other layers, so that the respective layers are transparent to one another.

When a current injected to the light-emitting region of each of the layers is ON/OFF-controlled by switching means 1212a to 1212c if necessary, a light flux having a desirable color which is a combination of colors of R, G, and B can be emitted from the uppermost surface of a light emitting device. In this embodiment, the ON/OFF of light emission is controlled by ON/OFF switching of the current injected to the light-emitting region of the photonic crystal. However, light emitted from each of the photonic crystals can be ON/OFF-controlled by using other switching methods described below.

FIGS. 14A1, 14A2, 14B, 14C, 14D1, 14D2, 14E1, 14E2, 14F1, and 14F2 show examples of a method of performing extraction switching of light from the point defect resonator or the photonic crystal. FIGS. 14A1 and 14A2 show an example in which a photonic crystal layer using liquid crystal as each of constituent mediums 221 and 222 is a switching layer. When an orientation of a liquid crystal molecule is controlled based on a voltage applied through electrodes provided outside the switching layer, a dielectric constant of the liquid crystal molecule is significantly changed according to the orientation. Therefore, a dielectric constant distribution of the photonic crystal is changed to shift the photonic band gap thereof.

As shown in FIG. 14A1, when a voltage is applied to the switching layer using liquid crystal through transparent electrodes, the orientations of liquid crystal molecules in each dispersed particle are aligned. Therefore, characteristics of liquid crystal molecules and a size and a frequency of a dispersion layer are set so as to produce a photonic band gap for a wavelength of light resonated by the point defect resonator located in the lower layer with the alignment state.

In contrast to this, as shown in FIG. 14A2, when no voltage is applied in the above-mentioned structure, the orientations of liquid crystal molecules in each dispersed particle become random. Therefore, the dielectric constant distribution of the switching layer is deviated from an ideal distribution required for producing the photonic band gap, so that power for reflecting light having a specific wavelength reduces. As a result, constant transmittance is provided for light resonated by the point defect resonator. Thus, light scattered by the dispersion layer is exited through the switching layer. In the above-mentioned structure, it is preferable that the photonic crystals located between the point defect resonator and the switching layer have several layers, the point defect resonator be well maintained, and a part of light resonated by the point defect resonator reach the switching layer.

Figure 15:
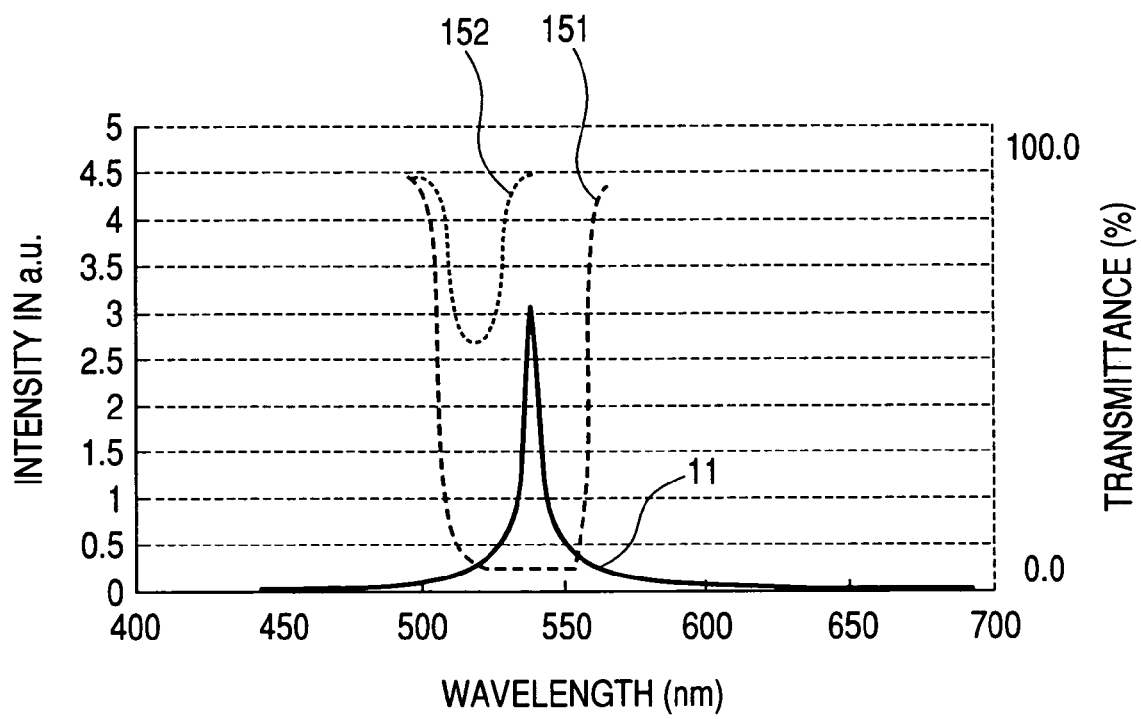
FIG. 15 is an explanatory graph showing a change in photonic band gap, which is caused by a switching mechanism.

FIG. 15 shows an example of a change in photonic band gap produced in the switching layer shown in FIGS. 14A1 and 14A2. When a voltage is applied to the switching layer, a relative large photonic band gap 151 is produced. Therefore, the switching layer acts as a reflection mirror with respect to light 11 emitted from the point defect resonator. On the other hand, when no voltage is applied to the switching layer, a photonic band gap 152 produced in the switching layer becomes incomplete. Therefore, the switching layer transmits the light 11 emitted from the point defect resonator.

When a desirable photonic band gap is obtained in the switching layer using the liquid crystal as shown in FIGS. 14A1 and 14A2, the constituent medium 211 may be made of the same material as that of a constituent medium 21 of a photonic crystal composing the light-emitting structure located in the lower layer or a material different from that of the constituent medium 21. FIGS. 14A1 and 14A2 show the case where the liquid crystal layer is located in the constituent medium 211. It is also possible to use a structure in which arrangement is reversed, that is, an inverse type structure in which the constituent medium is located in the liquid crystal layer.

FIG. 14B shows an example in which a photonic crystal layer using a ferroelectric material for a dispersion layer is provided as a switching layer. A voltage is applied to the switching layer through electrodes provided outside the switching layer to apply an electric field to a layer of the ferroelectric material, thereby finely deforming ferroelectric material. Therefore, a dielectric constant distribution of the photonic crystal is changed to shift the photonic band gap thereof.

Even when the ferroelectric material is used for the switching layer, as in the above-mentioned case where the liquid crystal is used, the photonic band gap is shifted according to an applied voltage to switch between the case where the switching layer has a surface reflecting light emitted from the point defect resonator located in the lower layer and the case where the switching layer has a surface transmitting the light.

In FIG. 14B, the ferroelectric material is used for the dispersion layer. A photonic crystal constituent medium may be the ferroelectric material when the material is sufficiently transparent to light to be used.

FIG. 14C shows an example of a photonic crystal in which a multi-layer film including a layer whose dielectric constant is variable is used as the switching layer. In the multi-layer film serving as the switching layer, for example, liquid crystal is used and an electric field is applied to the liquid crystal to change a dielectric constant with respect to a specific direction. Therefore, switching is performed between the case where the multi-layer film becomes a reflective film reflecting light emitted from the point defect resonator located in the lower layer and the case where the multi-layer film becomes a transmission film transmitting the light. When the case where the multi-layer film does not act as the reflective film depending on an angle of light incident thereon is to be prevented, it is preferable to use a switching method as shown in FIG. 14C for light extracted through the waveguide as shown in FIG. 8.

FIG. 14D1 shows an example in which a dielectric constant is changed by heat energy supplied from the outside to shift the PBG, thereby performing switching. When a heater 1410 is made in contact with a photonic crystal 1400, heat energy can be supplied thereto to control the PBG based on a change in dielectric constant which is caused by heating. As shown in FIG. 14D2, means for emitting light corresponding to a absorption wavelength of the photonic crystal or a Peltier element may be used as the heat energy supplying means.

FIGS. 14E1 and 14E2 shows an example in which the photonic crystal is deformed by external force to shift the PBG, thereby performing switching. An example of a deformation mechanism in which a drive mechanism 1420 is connected with a photonic crystal 1400 is shown. When the external force is applied to the photonic crystal structure due to extension or constriction of the drive mechanism 1420, the photonic crystal 1400 is extended or constricted. Therefore, structural parameters such as a lattice period of the photonic crystal and a filling ratio (volume ratio between a high-refraction material and a low-refraction material) changes, thereby changing an effective refraction index. Thus, the PBG can be controlled for light switching.

In FIGS. 14E1 and 14E2, the external force is applied to the entire photonic crystal to deform it. The external force may be applied to a portion of the structure. For example, the external force may be applied to the waveguide to perform switching.

A waveguide may be formed for switching as shown in FIGS. 14F1 and 14F2. FIGS. 14F1 and 14F2 show a structure in which only the waveguide is connected with the drive mechanism 1420 in the photonic crystal 1400.

When the drive mechanism 1420 is extended, a waveguide is located in the photonic crystal structure to produce the PBG, so that light does not leak to the outside. On the other hand, when the drive mechanism 1420 is constricted, the waveguide is taken from the photonic crystal structure to the outside to form a linear defect waveguide, so that light can be extracted from the photonic crystal to the outside. Therefore, switching can be performed.

The stacked light-emitting structure of the current injection type can be realized using the stacked three-dimensional photonic crystal provided with the above-mentioned light-emitting region. In this embodiment, the example in which only the three photonic crystal layers corresponding to the colors of R, G, and B are stacked is described. The number of photonic crystal layers is not limited to three. An arbitrary number of photonic crystal layers can be stacked if necessary. As described above, according to this embodiment, it is possible to realize a light-emitting device for full-color operation.

When stacked three-dimensional photonic crystals, each of which corresponds to a pixel are arranged, it is possible to obtain an image display apparatus capable of expressing an arbitrary color by combination of colors of R, G, and B based on an external signal.

Embodiment 2

Figure 16:
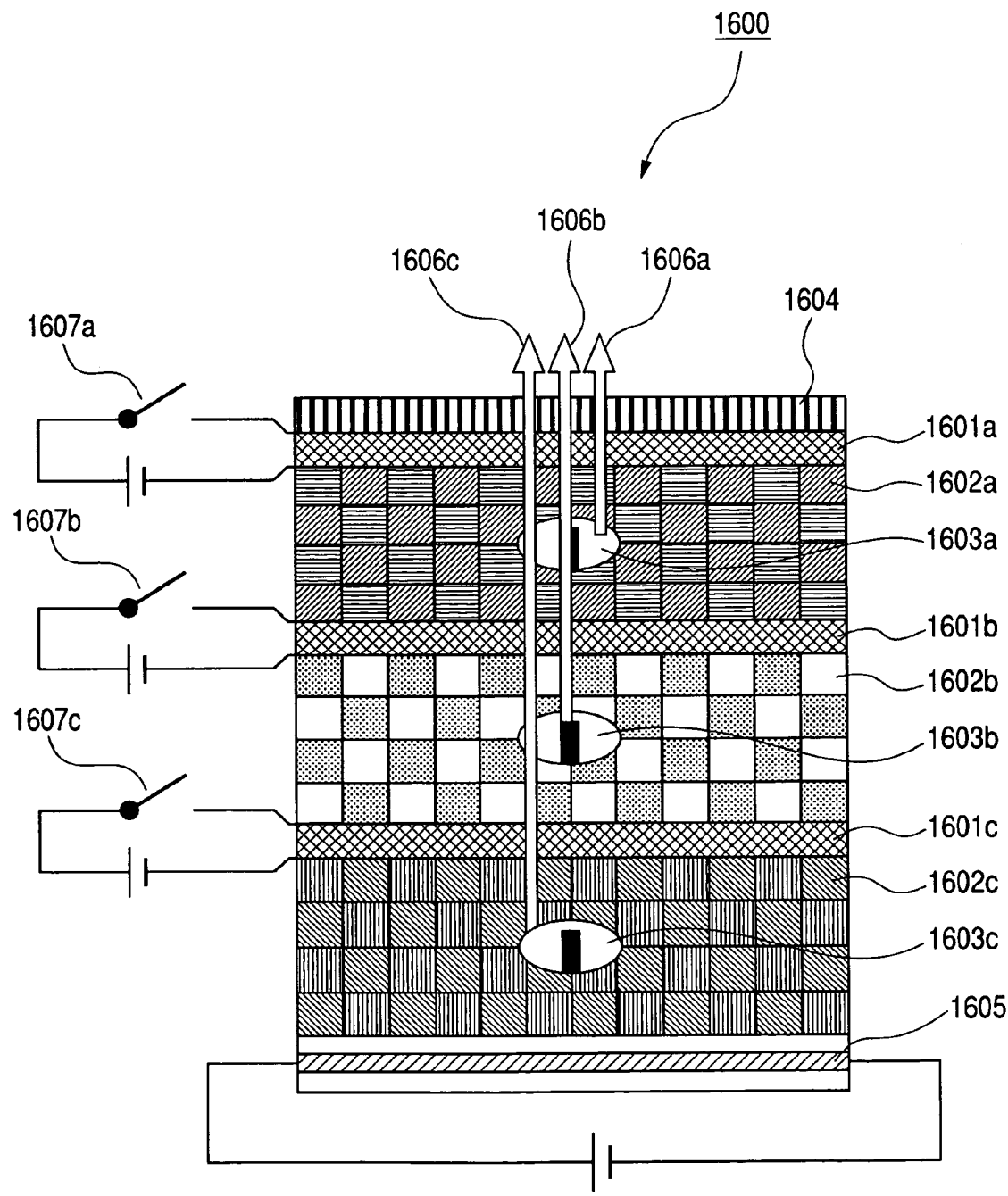
FIG. 16 is a schematic view showing a stacked light emitting structure using the optical excitation light emitting structure.

FIG. 16 shows a stacked light-emitting structure 1600 of an ultraviolet light excitation type. Three photonic crystal layers are stacked. A first photonic crystal layer is composed of a photonic crystal 1602a, a point defect resonator 1603a, and a switching layer 1601a. A second photonic crystal layer is composed of a photonic crystal 1602b, a point defect resonator 1603b, and a switching layer 1601b. A third photonic crystal layer is composed of a photonic crystal 1602c, a point defect resonator 1603c, and a switching layer 1601c. An ultraviolet light source 1605 that emits light having a wavelength capable of exciting fluorescent materials provided in the point defect resonators 1603a to 1603c is located in the lowest layer of the structure 1600. A wavelength selective filter 1604 that cuts off only light emitted from the ultraviolet light source 1605 is provided in the uppermost layer of the structure 1600.

The fluorescent materials provided in the point defect resonators 1603a to 1603c of the respective photonic crystal layers are excited by ultraviolet light emitted from the ultraviolet light source 1605 to cause light emission. Light beams having respective wavelengths, which are resonated by the point defect resonators 1603a to 1603c and extracted, travel toward the upper side of the stacked light emitting structure 1600 according to states of the switching layers 1601a to 1601c. At this time, the light beams extracted from the point defect resonators 1603a to 1603c are designed to the respective wavelengths corresponding to colors of R, G, and B, it is possible to realize a light-emitting device of the ultraviolet light excitation type for full-color operation.

The photonic crystal structures 1602a to 1602c and the point defect resonators 1603a to 1603c are identical to those shown in Tables 5 and 6. A relationship between a photonic band gap and a resonant wavelength is identical to that shown in FIG. 16. Note that each of the point defect resonators 1603a to 1603c has a fluorescent material that emits fluorescent light having a desirable wavelength through ultraviolet excitation. When a wavelength of 400 nm or less is used for the ultraviolet light source 1605, ultraviolet light can excite the fluorescent materials in the respective point defect resonators 1603a to 1603c because the respective photonic crystals shown in Table 5 are transparent to the ultraviolet light.

As an example of the fluorescent material that emits the fluorescent light through ultraviolet excitation, $Y_2O_2S:Eu$ in which an Eu ion as an impurity is added to $Y_2O_2S$ used as a host crystal can be used for red. Similarly, existing materials such as ZnS:Cu and Al can be used for green and existing materials such as ZnS:Ag and Cl can be used for blue.

Each of the switching layers 1601a to 1601c is the switching layer using the liquid crystal as described above using FIG. 14A1 and 14A2. When liquid crystal is aligned to a predetermined state, a PBG including a wavelength of light emitted from a corresponding point defect resonator is produced in response to a signal inputted from an outside to prevent the light from being emitted from the unit light emitting structure to an outside. When the liquid crystal is not aligned, each of the switching layers transmits light from a corresponding point defect resonator to exit the light toward the upper side. Any switching layer has a PGB in which it is transmissive of light emitted from each of other unit light emitting structures and light emitted from the ultraviolet light source 1605.

A structure of each of the switching layers 1601a to 1601c is not limited to the above-mentioned structure and can be selected as appropriate from a structure using a ferroelectric material, and the like.

The wavelength selective filter 1604 located in the uppermost layer prevents light emitted from the ultraviolet light source 1605 from being exited from the stacked light emitting structure to the outside. The wavelength selective filter 1604 may be made of a known ultraviolet absorbing material or a photonic crystal having a PBG including a wavelength of light emitted from the ultraviolet light source 1605. In particular, when a photonic crystal having a predetermined PBG is used for the wavelength selective filter 1604, use efficiency of an excitation light beam can be improved.

The stacked light emitting structure of the optical excitation type can be realized using the above-mentioned stacked three-dimensional photonic crystal. In this embodiment, the example in which only the three photonic crystal layers corresponding to the colors of R, G, and B are stacked is described. The number of photonic crystal layers is not limited to three. An arbitrary number of photonic crystal layers can be stacked if necessary. As described above, according to this embodiment, it is possible to realize a light-emitting device for full-color operation.

When stacked three-dimensional photonic crystals, each of which corresponds to a pixel are arranged, it is possible to obtain an image display apparatus capable of expressing an arbitrary color by combination of colors of R, G, and B based on an external signal.

Embodiment 3

Figure 17:
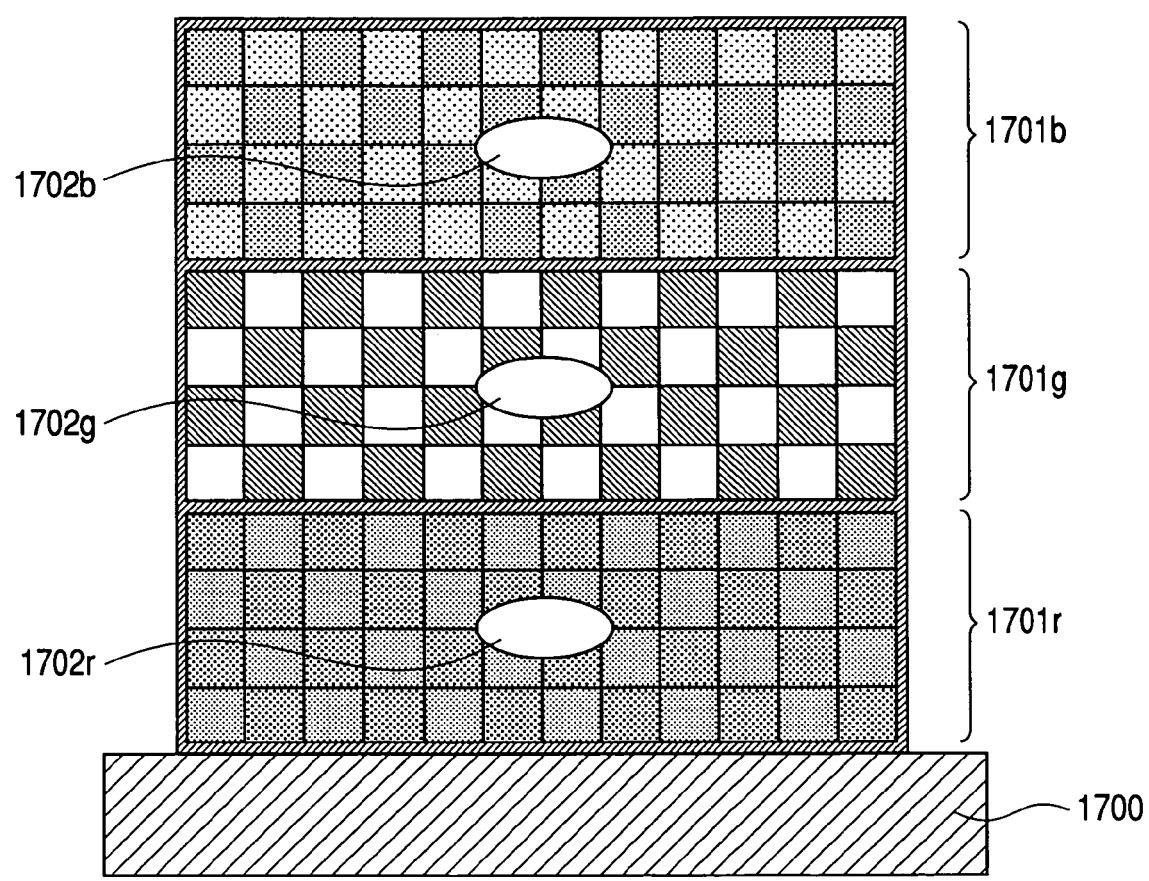
FIG. 17 is a schematic view showing a stacked three-dimensional photonic crystal.

Next, a deviation in light extraction efficiency due to a change in stack order of photonic crystal layers will be described. FIG. 17 is a schematic view showing a stacked three-dimensional photonic crystal. Three-dimensional photonic crystal layers 1701b, 1701g, and 1701r including point defect resonators 1702b, 1702g, and 1702r are stacked on a substrate 1700. Table 7 shows the three three-dimensional photonic crystal structures (1701b, 1701g, and 1701r).

TABLE 7

| | Structure | | |
|---|---|---|---|
| | 1701b | 1701g | 1701r |
| Grating structure | Inverse diamond opal | Inverse diamond opal | Inverse diamond opal |
| Constituent Material 6 | TiO$_2$ (n = 2.33) | TiO$_2$ (n = 2.33) | TiO$_2$ (n = 2.33) |

TABLE 7-continued

| | Structure | | |
|---|---|---|---|
| | 1701b | 1701g | 1701r |
| (refraction index) | | | |
| Constituent Material 7 (refraction index) | Air (or vacuum) (n = 1.00) | Air (or vacuum) (n = 1.00) | Air (or vacuum) (n = 1.00) |
| Dispersion layer radius | 0.30a (a means lattice period.) | 0.30a (a means lattice period.) | 0.30a (a means lattice period.) |
| Lattice period (a) | 300 nm | 365 nm | 432 nm |
| Resonant wavelength | 450 nm | 530 nm | 640 nm |

Figure 18:
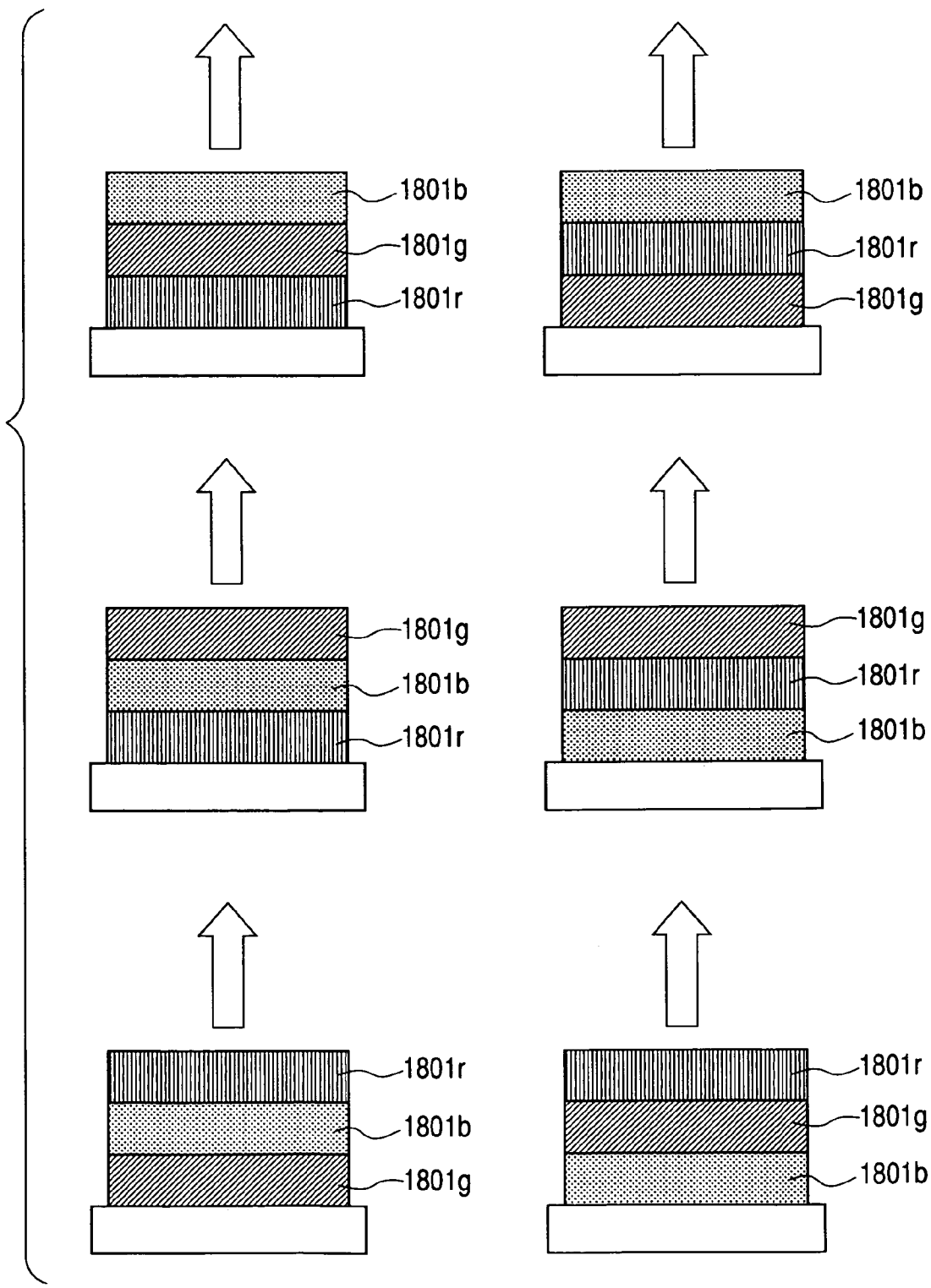
FIG. 18 is an explanatory view showing a stack order of a three-dimensional photonic crystal.

The case where the three three-dimensional photonic crystal layers are stacked in the normal direction of the substrate and light is extracted from the air side is assumed. At this time, it can be assumed that the number of combinations of the order in which the layers are stacked on the substrate is six. Combinations that light is more efficiently extracted from the air side are examined. FIG. 18 shows six kinds of combinations. In FIG. 18, an arrow indicates a light extraction direction.

Because the three three-dimensional photonic crystal layers having lattice periods different from one another are stacked, the respective structures thereof have photonic band gap regions different from one another. In the photonic band gap region, substantially 100% of light is reflected. For example, when a thickness of the structure 1701g described in Table 7 is set corresponding to eight frequencies, transmittance at a wavelength of 530 nm is 0.099%.

In the six kinds of combinations, it is examined how far light emitted from each of the three-dimensional photonic crystal layers travels toward the air side. A period of each of the photonic crystal structures is set to eight. Table 8 shows a result obtained by comparison based on transmittances to respective resonant wavelengths. With respect to G in the case of a stack order of (1) substrate-R-G-B, transmittance when light emitted from the photonic crystal layer 1701g is transmitted through the photonic crystal layer 1701b is 68.25% (G transmittance). Similarly, With respect to R, transmittance when light emitted from the photonic crystal layer 1701r is transmitted through the photonic crystal layers 1701g and 1701b is 67.15% (R transmittance).

TABLE 8

| Stack order | Transmittance B(450 nm) | Transmittance G(530 nm) | Transmittance R(640 nm) |
|---|---|---|---|
| (1)Substrate-R-G-B | — | 68.25% | 67.15% |
| (2)Substrate-G-R-B | — | 0.99% | 83.95% |
| (3)Substrate-R-B-G | 2.98% | — | 67.15% |
| (4)Substrate-B-R-G | 0.23% | — | 79.98% |
| (5)Substrate-G-B-R | 7.86% | 0.99% | — |
| (6)Substrate-B-G-R | 0.23% | 1.45% | — |

As shown in Table 8, the transmittance to each light is changed according to the order in which the photonic crystal layers are stacked on the substrate. Therefore, it is important to determine a suitable stack order.

In particular, in a region in which a wavelength of light is substantially equal to or several times longer than a lattice period, a phenomenon that diffraction efficiency becomes unstable in a wavelength band other than the photonic band gap has been known as an anomaly. For example, transmittance when light of blue is transmitted through the photonic crystal layer 1701*r* becomes lower.

As is apparent from Table 8, the case where the stack order is (1) substrate-R-G-B is best. In other words, when light extraction efficiency is to be improved, it is important to shift the wavelength of the light which becomes a light extraction object and a photonic band gap from each other and to stack the layers such that the central wavelengths of the respective photonic band gaps are successively shifted to a short wavelength side in a stack direction.

With respect to R, G, and B which are three primary colors of light in the above-mentioned description of the present invention, light whose central wavelength of light emitting spectrum is within a range of 600 nm to 670 nm is set to R (red), light whose central wavelength is within a range of 500 nm to 600 nm is set to G (green), and light whose central wavelength is within a range of 380 nm to 500nm is set to B (blue).

As described above, according to the present invention, it is possible to provide a light-emitting structure which can emit light having a plurality of wavelength distributions over a wide wavelength region from a single structure, can be integrated at high density, and can control a radiation mode pattern of radiation light.

This application claims priority from Japanese Patent Application No. 2004-116806 filed Apr. 12, 2004, and Japanese Patent Application No. 2005-102596filed Mar. 31, 2005 which are hereby incorporated by reference herein.

What is claimed is:

1. A stacked three-dimensional photonic crystal, comprising:
a plurality of three-dimensional photonic crystals having photonic band gaps different from one another, which are stacked,
wherein each of the plurality of three-dimensional photonic crystals includes a resonator in which a point defect is formed,
wherein the point defect contains an active medium that emits light through excitation, and wherein:
the resonators of the plurality of three-dimensional photonic crystals emit light beams having wavelengths different from one another in a stack direction, and
the plurality of three-dimensional photonic crystals are stacked to successively shift central wavelengths of the photonic band gaps to a short wavelength side in the stack direction.

2. A stacked three-dimensional photonic crystal according to claim 1, wherein the point defect contains an active medium that emits light through current injection.

3. A stacked three-dimensional photonic crystal according to claim 1, wherein the point defect contains an active medium that emits light through excitation light irradiation.

4. A light emitting device, comprising:
the stacked three-dimensional photonic crystal according to claim 1; and
excitation means for exciting an active medium.

5. A light emitting device according to claim 4, further comprising switching means for controlling a light emitting state of the light emitting device.

6. A light emitting device according to claim 5, wherein the switching means controls a drive signal supplied to the excitation means.

7. A light emitting device according to claim 5, wherein the switching means changes a resonant wavelength of each of the resonators to control the light emitting state of the light emitting device.

8. A light emitting device according to claim 5, wherein the switching means cuts off an optical path of light emitted from each of the resonators to control the light emitting state of the light emitting device.

9. A light emitting device according to claim 4, wherein the light emitting device emits light in a wavelength region corresponding to at least one of colors of R, G, and B.

10. An image display apparatus, comprising a plurality of light emitting devices which are arranged, each of which is the light emitting device according to any one of claims 4 to 9.

11. A stacked three-dimensional photonic crystal, comprising:
a plurality of three-dimensional photonic crystals having photonic band gaps different from one another, which are stacked,
wherein each of the plurality of three-dimensional photonic crystals includes a resonator in which a point defect is formed,
wherein the point defect contains an active medium that emits light through excitation, and wherein:
the resonators of the plurality of three-dimensional photonic crystals emit light beams having wavelengths different from one another in a direction reverse to a stack direction, and
the plurality of three-dimensional photonic crystals are stacked to successively shift central wavelengths of the photonic band gaps to a long wavelength side in the stack direction.

12. A stacked three-dimensional photonic crystal according to claim 11, wherein the point defect contains an active medium that emits light through current injection.

13. A stacked three-dimensional photonic crystal according to claim 11, wherein the point defect contains an active medium that emits light through excitation light irradiation.

14. A light emitting device, comprising:
the stacked three-dimensional photonic crystal according to claim 11; and
excitation means for exciting an active medium.

15. A light emitting device according to claim 14, further comprising switching means for controlling a light emitting state of the light emitting device.

16. A light emitting device according to claim 15, wherein the switching means controls a drive signal supplied to the excitation means.

17. A light emitting device according to claim 15, wherein the switching means changes a resonant wavelength of each of the resonators to control the light emitting state of the light emitting device.

18. A light emitting device according to claim 15, wherein the switching means cuts off an optical path of light emitted from each of the resonators to control the light emitting state of the light emitting device.

19. A light emitting device according to claim 14, wherein the light emitting device emits light in a wavelength region corresponding to at least one of colors of R, G, and B.

20. An image display apparatus, comprising a plurality of light emitting devices which are arranged, each of which is the light emitting device according to any one of claims 14 to 19.

* * * * *